(12) United States Patent
Rodda et al.

(10) Patent No.: US 9,426,343 B2
(45) Date of Patent: Aug. 23, 2016

(54) ARRAY CAMERAS INCORPORATING INDEPENDENTLY ALIGNED LENS STACKS

(71) Applicant: Pelican Imaging Corporation, Santa Clara, CA (US)

(72) Inventors: Errol Mark Rodda, San Jose, CA (US); Jacques Duparré, Jena (DE)

(73) Assignee: Pelican Imaging Corporation, Santa Clara, CA (US)

( * ) Notice: Subject to any disclaimer, the term of this patent is extended or adjusted under 35 U.S.C. 154(b) by 106 days.

(21) Appl. No.: 14/536,554

(22) Filed: Nov. 7, 2014

(65) Prior Publication Data

US 2015/0124113 A1 May 7, 2015

Related U.S. Application Data

(63) Continuation of application No. 14/536,537, filed on Nov. 7, 2014, now Pat. No. 9,185,276.

(60) Provisional application No. 61/904,947, filed on Nov. 15, 2013, provisional application No. 61/901,378, filed on Nov. 7, 2013.

(51) Int. Cl.
*H04N 5/225* (2006.01)
*G02B 27/62* (2006.01)
(Continued)

(52) U.S. Cl.
CPC ............... *H04N 5/2253* (2013.01); *G02B 7/02* (2013.01); *G02B 27/62* (2013.01); *H01L 25/042* (2013.01);
(Continued)

(58) Field of Classification Search
CPC ... H04N 5/2253; H04N 5/2257; H04N 9/045; H04N 9/735; H04N 5/2355; H04N 5/369; H04N 9/04; H04N 5/2254; H04N 5/2258; H01L 27/14618; H01L 27/14621; H01L 27/14625; H01L 25/042; G02B 7/02
See application file for complete search history.

(56) References Cited

U.S. PATENT DOCUMENTS 4,124,798 A 11/1978 Thompson
4,198,646 A 4/1980 Alexander et al.
(Continued)

FOREIGN PATENT DOCUMENTS

EP 840502 A2 5/1998
EP 2336816 A2 6/2011
(Continued)

OTHER PUBLICATIONS

International Preliminary Report on Patentability for International Application PCT/US2013/024987, Mailed Aug. 21, 2014, 13 Pgs.
(Continued)

*Primary Examiner* — Mekonnen Dagnew
(74) *Attorney, Agent, or Firm* — KPPB LLP

(57) ABSTRACT

Array cameras, and array camera modules incorporating independently aligned lens stacks are disclosed. Processes for manufacturing array camera modules including independently aligned lens stacks can include: forming at least one hole in at least one carrier; mounting the at least one carrier relative to at least one sensor so that light passing through the at least one hole in the at least one carrier is incident on a plurality of focal planes formed by arrays of pixels on the at least one sensor; and independently mounting a plurality of lens barrels to the at least one carrier, so that a lens stack in each lens barrel directs light through the at least one hole in the at least one carrier and focuses the light onto one of the plurality of focal planes.

29 Claims, 17 Drawing Sheets

(51) Int. Cl.

| | | |
|---|---|---|
| *G02B 7/02* | (2006.01) | |
| *H01L 25/04* | (2014.01) | |
| *H04N 5/235* | (2006.01) | |
| *H04N 5/369* | (2011.01) | |
| *H04N 9/04* | (2006.01) | |
| *H04N 9/73* | (2006.01) | |
| *H01L 27/146* | (2006.01) | |

(52) U.S. Cl.
CPC .... *H01L 27/14618* (2013.01); *H01L 27/14621* (2013.01); *H01L 27/14625* (2013.01); *H04N 5/2254* (2013.01); *H04N 5/2257* (2013.01); *H04N 5/2258* (2013.01); *H04N 5/2355* (2013.01); *H04N 5/369* (2013.01); *H04N 9/04* (2013.01); *H04N 9/045* (2013.01); *H04N 9/735* (2013.01); *H01L 2924/0002* (2013.01); *Y10T 29/49826* (2015.01); *Y10T 156/1056* (2015.01); *Y10T 156/1062* (2015.01); *Y10T 156/1304* (2015.01); *Y10T 156/1309* (2015.01)

(56) References Cited

U.S. PATENT DOCUMENTS

| | | | |
|---|---|---|---|
| 4,323,925 | A | 4/1982 | Abell et al. |
| 4,460,449 | A | 7/1984 | Montalbano |
| 4,467,365 | A | 8/1984 | Murayama et al. |
| 5,005,083 | A | 4/1991 | Grage |
| 5,070,414 | A | 12/1991 | Tsutsumi |
| 5,144,448 | A | 9/1992 | Hornbaker |
| 5,327,125 | A | 7/1994 | Iwase et al. |
| 5,629,524 | A | 5/1997 | Stettner et al. |
| 5,808,350 | A | 9/1998 | Jack et al. |
| 5,832,312 | A | 11/1998 | Rieger et al. |
| 5,880,691 | A | 3/1999 | Fossum et al. |
| 5,933,190 | A | 8/1999 | Dierickx et al. |
| 5,973,844 | A | 10/1999 | Burger |
| 6,002,743 | A | 12/1999 | Telymonde |
| 6,034,690 | A | 3/2000 | Gallery et al. |
| 6,069,351 | A | 5/2000 | Mack |
| 6,069,365 | A | 5/2000 | Chow et al. |
| 6,097,394 | A | 8/2000 | Levoy et al. |
| 6,124,974 | A | 9/2000 | Burger |
| 6,137,535 | A | 10/2000 | Meyers |
| 6,141,048 | A | 10/2000 | Meyers |
| 6,160,909 | A | 12/2000 | Melen |
| 6,205,241 | B1 | 3/2001 | Melen |
| 6,358,862 | B1 | 3/2002 | Ireland et al. |
| 6,477,260 | B1 | 11/2002 | Shimomura |
| 6,603,513 | B1 | 8/2003 | Berezin |
| 6,611,289 | B1 | 8/2003 | Yu |
| 6,627,896 | B1 | 9/2003 | Hashimoto et al. |
| 6,635,941 | B2 | 10/2003 | Suda |
| 6,657,218 | B2 | 12/2003 | Noda |
| 6,671,399 | B1 | 12/2003 | Berestov |
| 6,750,904 | B1 | 6/2004 | Lambert |
| 6,765,617 | B1 | 7/2004 | Tangen et al. |
| 6,771,833 | B1 | 8/2004 | Edgar |
| 6,774,941 | B1 | 8/2004 | Boisvert et al. |
| 6,819,358 | B1 | 11/2004 | Kagle et al. |
| 6,879,735 | B1 | 4/2005 | Portniaguine et al. |
| 6,903,770 | B1 | 6/2005 | Kobayashi et al. |
| 6,909,121 | B2 | 6/2005 | Nishikawa |
| 6,958,862 | B1 | 10/2005 | Joseph |
| 7,085,409 | B2 | 8/2006 | Sawhney et al. |
| 7,199,348 | B2 | 4/2007 | Olsen et al. |
| 7,262,799 | B2 | 8/2007 | Suda |
| 7,292,735 | B2 | 11/2007 | Blake et al. |
| 7,295,697 | B1 | 11/2007 | Satoh |
| 7,369,165 | B2 | 5/2008 | Bosco et al. |
| 7,391,572 | B2 | 6/2008 | Jacobowitz et al. |
| 7,606,484 | B1 | 10/2009 | Richards et al. |
| 7,633,511 | B2 | 12/2009 | Shum et al. |
| 7,657,090 | B2 | 2/2010 | Omatsu et al. |
| 7,675,080 | B2 | 3/2010 | Boettiger |
| 7,675,681 | B2 | 3/2010 | Tomikawa et al. |
| 7,706,634 | B2 | 4/2010 | Schmitt et al. |
| 7,723,662 | B2 | 5/2010 | Levoy et al. |
| 7,782,364 | B2 | 8/2010 | Smith |
| 7,840,067 | B2 | 11/2010 | Shen et al. |
| 7,912,673 | B2 | 3/2011 | Hébert et al. |
| 7,986,018 | B2 | 7/2011 | Rennie |
| 7,990,447 | B2 | 8/2011 | Honda et al. |
| 8,000,498 | B2 | 8/2011 | Shih et al. |
| 8,013,904 | B2 | 9/2011 | Tan et al. |
| 8,027,531 | B2 | 9/2011 | Wilburn et al. |
| 8,044,994 | B2 | 10/2011 | Vetro et al. |
| 8,077,245 | B2 | 12/2011 | Adamo et al. |
| 8,106,949 | B2 | 1/2012 | Tan et al. |
| 8,126,279 | B2 | 2/2012 | Marcellin et al. |
| 8,131,097 | B2 | 3/2012 | Lelescu et al. |
| 8,164,629 | B1 | 4/2012 | Zhang |
| 8,180,145 | B2 | 5/2012 | Wu et al. |
| 8,189,089 | B1 | 5/2012 | Georgiev |
| 8,213,711 | B2 | 7/2012 | Tam |
| 8,231,814 | B2 | 7/2012 | Duparre |
| 8,242,426 | B2 | 8/2012 | Ward et al. |
| 8,244,027 | B2 | 8/2012 | Takahashi |
| 8,254,668 | B2 | 8/2012 | Mashitani et al. |
| 8,279,325 | B2 | 10/2012 | Pitts et al. |
| 8,280,194 | B2 | 10/2012 | Wong et al. |
| 8,294,099 | B2 | 10/2012 | Blackwell, Jr. |
| 8,305,456 | B1 | 11/2012 | McMahon |
| 8,315,476 | B1 | 11/2012 | Georgiev et al. |
| 8,345,144 | B1 | 1/2013 | Georgiev et al. |
| 8,360,574 | B2 | 1/2013 | Ishak et al. |
| 8,406,562 | B2 | 3/2013 | Bassi et al. |
| 8,446,492 | B2 | 5/2013 | Nakano et al. |
| 8,514,491 | B2 | 8/2013 | Duparre |
| 8,541,730 | B2 | 9/2013 | Inuiya |
| 8,542,933 | B2 | 9/2013 | Venkataraman et al. |
| 8,553,093 | B2 | 10/2013 | Wong et al. |
| 8,619,082 | B1 | 12/2013 | Ciurea et al. |
| 8,655,052 | B2 | 2/2014 | Spooner et al. |
| 8,682,107 | B2 | 3/2014 | Yoon et al. |
| 8,692,893 | B2 | 4/2014 | McMahon |
| 8,773,536 | B1 | 7/2014 | Zhang |
| 8,780,113 | B1 | 7/2014 | Ciurea et al. |
| 8,804,255 | B2 | 8/2014 | Duparre |
| 8,831,367 | B2 | 9/2014 | Venkataraman et al. |
| 8,854,462 | B2 | 10/2014 | Herbin et al. |
| 8,861,089 | B2 | 10/2014 | Duparre |
| 8,866,912 | B2 | 10/2014 | Mullis |
| 8,866,920 | B2 | 10/2014 | Venkataraman et al. |
| 8,878,950 | B2 | 11/2014 | Lelescu et al. |
| 8,885,059 | B1 | 11/2014 | Venkataraman et al. |
| 8,896,594 | B2 | 11/2014 | Xiong et al. |
| 8,896,719 | B1 | 11/2014 | Venkataraman et al. |
| 8,902,321 | B2 | 12/2014 | Venkataraman et al. |
| 2001/0005225 | A1 | 6/2001 | Clark et al. |
| 2001/0019621 | A1 | 9/2001 | Hanna et al. |
| 2001/0038387 | A1 | 11/2001 | Tomooka et al. |
| 2002/0012056 | A1 | 1/2002 | Trevino et al. |
| 2002/0027608 | A1 | 3/2002 | Johnson |
| 2002/0039438 | A1 | 4/2002 | Mori et al. |
| 2002/0063807 | A1 | 5/2002 | Margulis |
| 2002/0087403 | A1 | 7/2002 | Meyers et al. |
| 2002/0089596 | A1 | 7/2002 | Suda |
| 2002/0094027 | A1 | 7/2002 | Sato et al. |
| 2002/0101528 | A1 | 8/2002 | Lee |
| 2002/0113867 | A1 | 8/2002 | Takigawa et al. |
| 2002/0113888 | A1 | 8/2002 | Sonoda et al. |
| 2002/0163054 | A1 | 11/2002 | Suda et al. |
| 2002/0167537 | A1 | 11/2002 | Trajkovic |
| 2002/0177054 | A1 | 11/2002 | Saitoh et al. |
| 2003/0086079 | A1 | 5/2003 | Barth et al. |
| 2003/0124763 | A1 | 7/2003 | Fan et al. |
| 2003/0140347 | A1 | 7/2003 | Varsa |
| 2003/0179418 | A1 | 9/2003 | Wengender et al. |
| 2003/0190072 | A1 | 10/2003 | Adkins et al. |
| 2003/0211405 | A1 | 11/2003 | Venkataraman |
| 2004/0008271 | A1 | 1/2004 | Hagimori et al. |
| 2004/0012689 | A1 | 1/2004 | Tinnerino |
| 2004/0027358 | A1 | 2/2004 | Nakao |

(56) References Cited

U.S. PATENT DOCUMENTS

| | | |
|---|---|---|
| 2004/0047274 A1 | 3/2004 | Amanai |
| 2004/0050104 A1 | 3/2004 | Ghosh et al. |
| 2004/0056966 A1 | 3/2004 | Schechner et al. |
| 2004/0066454 A1 | 4/2004 | Otani et al. |
| 2004/0100570 A1 | 5/2004 | Shizukuishi |
| 2004/0114807 A1 | 6/2004 | Lelescu et al. |
| 2004/0151401 A1 | 8/2004 | Sawhney et al. |
| 2004/0165090 A1 | 8/2004 | Ning |
| 2004/0169617 A1 | 9/2004 | Yelton et al. |
| 2004/0170340 A1 | 9/2004 | Tipping et al. |
| 2004/0174439 A1 | 9/2004 | Upton |
| 2004/0207836 A1 | 10/2004 | Chhibber et al. |
| 2004/0213449 A1 | 10/2004 | Safaee-Rad et al. |
| 2004/0218809 A1 | 11/2004 | Blake et al. |
| 2004/0234873 A1 | 11/2004 | Venkataraman |
| 2004/0240052 A1 | 12/2004 | Minefuji et al. |
| 2004/0251509 A1 | 12/2004 | Choi |
| 2004/0264806 A1 | 12/2004 | Herley |
| 2005/0006477 A1 | 1/2005 | Patel |
| 2005/0012035 A1 | 1/2005 | Miller |
| 2005/0036778 A1 | 2/2005 | DeMonte |
| 2005/0048690 A1 | 3/2005 | Yamamoto |
| 2005/0068436 A1 | 3/2005 | Fraenkel et al. |
| 2005/0132098 A1 | 6/2005 | Sonoda et al. |
| 2005/0134712 A1 | 6/2005 | Gruhlke et al. |
| 2005/0147277 A1 | 7/2005 | Higaki et al. |
| 2005/0151759 A1 | 7/2005 | Gonzalez-Banos et al. |
| 2005/0175257 A1 | 8/2005 | Kuroki |
| 2005/0185711 A1 | 8/2005 | Pfister et al. |
| 2005/0205785 A1 | 9/2005 | Hornback et al. |
| 2005/0219363 A1 | 10/2005 | Kohler |
| 2005/0225654 A1 | 10/2005 | Feldman et al. |
| 2005/0275946 A1 | 12/2005 | Choo et al. |
| 2005/0286612 A1 | 12/2005 | Takanashi |
| 2006/0002635 A1 | 1/2006 | Nestares et al. |
| 2006/0023197 A1 | 2/2006 | Joel |
| 2006/0023314 A1 | 2/2006 | Boettiger et al. |
| 2006/0033005 A1 | 2/2006 | Jerdev et al. |
| 2006/0038891 A1 | 2/2006 | Okutomi et al. |
| 2006/0049930 A1 | 3/2006 | Zruya et al. |
| 2006/0054780 A1 | 3/2006 | Garrood et al. |
| 2006/0054782 A1 | 3/2006 | Olsen et al. |
| 2006/0055811 A1 | 3/2006 | Frtiz et al. |
| 2006/0072029 A1 | 4/2006 | Miyatake et al. |
| 2006/0087747 A1 | 4/2006 | Ohzawa et al. |
| 2006/0098888 A1 | 5/2006 | Morishita |
| 2006/0125936 A1 | 6/2006 | Gruhike et al. |
| 2006/0138322 A1 | 6/2006 | Costello et al. |
| 2006/0152803 A1 | 7/2006 | Provitola |
| 2006/0159369 A1 | 7/2006 | Young |
| 2006/0176566 A1 | 8/2006 | Boettiger et al. |
| 2006/0187338 A1 | 8/2006 | May et al. |
| 2006/0203113 A1 | 9/2006 | Wada et al. |
| 2006/0210186 A1 | 9/2006 | Berkner |
| 2006/0239549 A1 | 10/2006 | Kelly et al. |
| 2006/0243889 A1 | 11/2006 | Farnworth et al. |
| 2006/0251410 A1 | 11/2006 | Trutna |
| 2006/0274174 A1 | 12/2006 | Tewinkle |
| 2006/0278948 A1 | 12/2006 | Yamaguchi et al. |
| 2006/0279648 A1 | 12/2006 | Senba et al. |
| 2007/0002159 A1 | 1/2007 | Olsen et al. |
| 2007/0024614 A1 | 2/2007 | Tam |
| 2007/0036427 A1 | 2/2007 | Nakamura et al. |
| 2007/0040828 A1 | 2/2007 | Zalevsky et al. |
| 2007/0040922 A1 | 2/2007 | McKee et al. |
| 2007/0041391 A1 | 2/2007 | Lin et al. |
| 2007/0052825 A1 | 3/2007 | Cho |
| 2007/0083114 A1 | 4/2007 | Yang et al. |
| 2007/0085917 A1 | 4/2007 | Kobayashi |
| 2007/0102622 A1 | 5/2007 | Olsen et al. |
| 2007/0126898 A1 | 6/2007 | Feldman |
| 2007/0127831 A1 | 6/2007 | Venkataraman |
| 2007/0139333 A1 | 6/2007 | Sato et al. |
| 2007/0146511 A1 | 6/2007 | Kinoshita et al. |
| 2007/0159541 A1 | 7/2007 | Sparks et al. |
| 2007/0160310 A1 | 7/2007 | Tanida et al. |
| 2007/0165931 A1 | 7/2007 | Higaki |
| 2007/0171290 A1 | 7/2007 | Kroger |
| 2007/0211164 A1 | 9/2007 | Olsen et al. |
| 2007/0216765 A1 | 9/2007 | Wong et al. |
| 2007/0228256 A1 | 10/2007 | Mentzer |
| 2007/0257184 A1 | 11/2007 | Olsen et al. |
| 2007/0258006 A1 | 11/2007 | Olsen et al. |
| 2007/0258706 A1 | 11/2007 | Raskar et al. |
| 2007/0263114 A1 | 11/2007 | Gurevich et al. |
| 2007/0268374 A1 | 11/2007 | Robinson |
| 2007/0296835 A1 | 12/2007 | Olsen et al. |
| 2008/0019611 A1 | 1/2008 | Larkin |
| 2008/0025649 A1 | 1/2008 | Liu et al. |
| 2008/0030597 A1 | 2/2008 | Olsen et al. |
| 2008/0043095 A1 | 2/2008 | Vetro et al. |
| 2008/0043096 A1 | 2/2008 | Vetro et al. |
| 2008/0062164 A1 | 3/2008 | Bassi et al. |
| 2008/0079805 A1 | 4/2008 | Takagi et al. |
| 2008/0080028 A1 | 4/2008 | Bakin et al. |
| 2008/0084486 A1 | 4/2008 | Enge et al. |
| 2008/0088793 A1 | 4/2008 | Sverdrup et al. |
| 2008/0112635 A1 | 5/2008 | Kondo et al. |
| 2008/0118241 A1 | 5/2008 | Tekolste et al. |
| 2008/0131019 A1 | 6/2008 | Ng |
| 2008/0131107 A1 | 6/2008 | Ueno |
| 2008/0151097 A1 | 6/2008 | Chen et al. |
| 2008/0152215 A1 | 6/2008 | Horie et al. |
| 2008/0152296 A1 | 6/2008 | Oh et al. |
| 2008/0158259 A1 | 7/2008 | Kempf et al. |
| 2008/0158375 A1 | 7/2008 | Kakkori et al. |
| 2008/0193026 A1 | 8/2008 | Horie et al. |
| 2008/0218610 A1 | 9/2008 | Chapman et al. |
| 2008/0219654 A1 | 9/2008 | Border et al. |
| 2008/0240598 A1 | 10/2008 | Hasegawa |
| 2008/0247638 A1 | 10/2008 | Tanida et al. |
| 2008/0247653 A1 | 10/2008 | Moussavi et al. |
| 2008/0272416 A1 | 11/2008 | Yun |
| 2008/0273751 A1 | 11/2008 | Yuan et al. |
| 2008/0278591 A1 | 11/2008 | Barna et al. |
| 2008/0298674 A1 | 12/2008 | Baker et al. |
| 2009/0050946 A1 | 2/2009 | Duparre et al. |
| 2009/0052743 A1 | 2/2009 | Techmer |
| 2009/0060281 A1 | 3/2009 | Tanida et al. |
| 2009/0086074 A1 | 4/2009 | Li et al. |
| 2009/0091806 A1 | 4/2009 | Inuiya |
| 2009/0102956 A1 | 4/2009 | Georgiev |
| 2009/0109306 A1 | 4/2009 | Shan et al. |
| 2009/0128833 A1 | 5/2009 | Yahav |
| 2009/0167922 A1 | 7/2009 | Perlman et al. |
| 2009/0179142 A1 | 7/2009 | Duparre et al. |
| 2009/0180021 A1 | 7/2009 | Kikuchi et al. |
| 2009/0200622 A1 | 8/2009 | Tai et al. |
| 2009/0201371 A1 | 8/2009 | Matsuda et al. |
| 2009/0207235 A1 | 8/2009 | Francini et al. |
| 2009/0225203 A1 | 9/2009 | Tanida et al. |
| 2009/0237520 A1 | 9/2009 | Kaneko et al. |
| 2009/0268192 A1 | 10/2009 | Koenck et al. |
| 2009/0268983 A1 | 10/2009 | Stone |
| 2009/0274387 A1 | 11/2009 | Jin |
| 2009/0284651 A1 | 11/2009 | Srinivasan |
| 2009/0297056 A1 | 12/2009 | Lelescu et al. |
| 2009/0302205 A9* | 12/2009 | Olsen .............. H01L 27/14634 250/226 |
| 2009/0323195 A1 | 12/2009 | Hembree et al. |
| 2009/0323206 A1 | 12/2009 | Oliver et al. |
| 2009/0324118 A1 | 12/2009 | Maslov et al. |
| 2010/0002126 A1 | 1/2010 | Wenstrand et al. |
| 2010/0002313 A1 | 1/2010 | Duparre et al. |
| 2010/0002314 A1 | 1/2010 | Duparre |
| 2010/0053342 A1 | 3/2010 | Hwang et al. |
| 2010/0053600 A1 | 3/2010 | Tanida et al. |
| 2010/0060746 A9 | 3/2010 | Olsen et al. |
| 2010/0086227 A1 | 4/2010 | Sun et al. |
| 2010/0091389 A1 | 4/2010 | Henriksen et al. |
| 2010/0097491 A1 | 4/2010 | Farina et al. |
| 2010/0103259 A1 | 4/2010 | Tanida et al. |
| 2010/0103308 A1 | 4/2010 | Butterfield et al. |
| 2010/0111444 A1 | 5/2010 | Coffman |

(56) References Cited

U.S. PATENT DOCUMENTS

| | | |
|---|---|---|
| 2010/0118127 A1 | 5/2010 | Nam et al. |
| 2010/0133230 A1 | 6/2010 | Henriksen et al. |
| 2010/0141802 A1 | 6/2010 | Knight et al. |
| 2010/0142839 A1 | 6/2010 | Lakus-Becker |
| 2010/0157073 A1 | 6/2010 | Kondo et al. |
| 2010/0165152 A1 | 7/2010 | Lim |
| 2010/0177411 A1 | 7/2010 | Hegde et al. |
| 2010/0194901 A1 | 8/2010 | van Hoorebeke et al. |
| 2010/0195716 A1 | 8/2010 | Klein et al. |
| 2010/0201834 A1 | 8/2010 | Maruyama et al. |
| 2010/0208100 A9 | 8/2010 | Olsen et al. |
| 2010/0220212 A1 | 9/2010 | Perlman et al. |
| 2010/0231285 A1 | 9/2010 | Boomer et al. |
| 2010/0244165 A1 | 9/2010 | Lake et al. |
| 2010/0265385 A1 | 10/2010 | Knight et al. |
| 2010/0281070 A1 | 11/2010 | Chan et al. |
| 2010/0302423 A1 | 12/2010 | Adams, Jr. et al. |
| 2011/0001037 A1 | 1/2011 | Tewinkle |
| 2011/0018973 A1 | 1/2011 | Takayama |
| 2011/0032370 A1 | 2/2011 | Ludwig |
| 2011/0043661 A1 | 2/2011 | Podoleanu |
| 2011/0043665 A1 | 2/2011 | Ogasahara |
| 2011/0043668 A1 | 2/2011 | McKinnon et al. |
| 2011/0069189 A1 | 3/2011 | Venkataraman et al. |
| 2011/0080487 A1 | 4/2011 | Venkataraman et al. |
| 2011/0108708 A1 | 5/2011 | Olsen et al. |
| 2011/0121421 A1 | 5/2011 | Charbon et al. |
| 2011/0122308 A1 | 5/2011 | Duparre |
| 2011/0128412 A1 | 6/2011 | Milnes et al. |
| 2011/0149408 A1 | 6/2011 | Hahgholt et al. |
| 2011/0149409 A1 | 6/2011 | Haugholt et al. |
| 2011/0153248 A1 | 6/2011 | Gu et al. |
| 2011/0157321 A1 | 6/2011 | Nakajima et al. |
| 2011/0176020 A1 | 7/2011 | Chang |
| 2011/0211824 A1 | 9/2011 | Georgiev et al. |
| 2011/0221599 A1 | 9/2011 | Högasten |
| 2011/0221658 A1 | 9/2011 | Haddick et al. |
| 2011/0221939 A1 | 9/2011 | Jerdev |
| 2011/0234841 A1 | 9/2011 | Akeley et al. |
| 2011/0241234 A1 | 10/2011 | Duparre |
| 2011/0242342 A1 | 10/2011 | Goma et al. |
| 2011/0242355 A1 | 10/2011 | Goma et al. |
| 2011/0242356 A1 | 10/2011 | Aleksic et al. |
| 2011/0255592 A1 | 10/2011 | Sung et al. |
| 2011/0267348 A1 | 11/2011 | Lin et al. |
| 2011/0273531 A1 | 11/2011 | Ito et al. |
| 2011/0274366 A1 | 11/2011 | Tardif |
| 2011/0279721 A1 | 11/2011 | McMahon |
| 2011/0285866 A1 | 11/2011 | Bhrugumalla et al. |
| 2011/0298917 A1 | 12/2011 | Yanagita |
| 2011/0300929 A1 | 12/2011 | Tardif et al. |
| 2011/0310980 A1 | 12/2011 | Mathew |
| 2011/0317766 A1 | 12/2011 | Lim et al. |
| 2012/0012748 A1 | 1/2012 | Pain et al. |
| 2012/0026297 A1 | 2/2012 | Sato |
| 2012/0026342 A1 | 2/2012 | Yu et al. |
| 2012/0039525 A1 | 2/2012 | Tian et al. |
| 2012/0044249 A1 | 2/2012 | Mashitani et al. |
| 2012/0044372 A1 | 2/2012 | Côté et al. |
| 2012/0069235 A1 | 3/2012 | Imai |
| 2012/0113413 A1 | 5/2012 | Miahczylowicz-Wolski et al. |
| 2012/0147139 A1 | 6/2012 | Li et al. |
| 2012/0147205 A1 | 6/2012 | Lelescu et al. |
| 2012/0154551 A1 | 6/2012 | Inoue |
| 2012/0170134 A1 | 7/2012 | Bolis et al. |
| 2012/0176479 A1 | 7/2012 | Mayhew et al. |
| 2012/0198677 A1 | 8/2012 | Duparre |
| 2012/0200734 A1 | 8/2012 | Tang |
| 2012/0229628 A1 | 9/2012 | Ishiyama et al. |
| 2012/0249550 A1 | 10/2012 | Akeley et al. |
| 2012/0262607 A1 | 10/2012 | Shimura et al. |
| 2012/0287291 A1 | 11/2012 | McMahon et al. |
| 2012/0293695 A1 | 11/2012 | Tanaka |
| 2012/0314033 A1 | 12/2012 | Lee et al. |
| 2012/0327222 A1 | 12/2012 | Ng et al. |
| 2013/0002828 A1 | 1/2013 | Ding et al. |
| 2013/0003184 A1 | 1/2013 | Duparre |
| 2013/0010073 A1 | 1/2013 | Do |
| 2013/0022111 A1 | 1/2013 | Chen et al. |
| 2013/0027580 A1 | 1/2013 | Olsen et al. |
| 2013/0033579 A1 | 2/2013 | Wajs |
| 2013/0050504 A1 | 2/2013 | Safaee-Rad et al. |
| 2013/0050526 A1 | 2/2013 | Keelan |
| 2013/0057710 A1 | 3/2013 | McMahon |
| 2013/0070060 A1 | 3/2013 | Chatterjee |
| 2013/0077880 A1 | 3/2013 | Venkataraman et al. |
| 2013/0077882 A1 | 3/2013 | Venkataraman et al. |
| 2013/0088637 A1 | 4/2013 | Duparre |
| 2013/0113899 A1 | 5/2013 | Morohoshi et al. |
| 2013/0120605 A1 | 5/2013 | Georgiev et al. |
| 2013/0128068 A1 | 5/2013 | Georgiev et al. |
| 2013/0128069 A1 | 5/2013 | Georgiev et al. |
| 2013/0128087 A1 | 5/2013 | Georgiev et al. |
| 2013/0128121 A1 | 5/2013 | Agarwala et al. |
| 2013/0147979 A1 | 6/2013 | McMahon et al. |
| 2013/0215108 A1 | 8/2013 | McMahon et al. |
| 2013/0222556 A1 | 8/2013 | Shimada |
| 2013/0229540 A1 | 9/2013 | Farina et al. |
| 2013/0259317 A1 | 10/2013 | Gaddy |
| 2013/0265459 A1 | 10/2013 | Duparre et al. |
| 2014/0009586 A1 | 1/2014 | McNamer et al. |
| 2014/0076336 A1 | 3/2014 | Clayton et al. |
| 2014/0079336 A1 | 3/2014 | Venkataraman et al. |
| 2014/0092281 A1 | 4/2014 | Nisenzon et al. |
| 2014/0132810 A1 | 5/2014 | McMahon |
| 2014/0176592 A1 | 6/2014 | Wilburn et al. |
| 2014/0198188 A1 | 7/2014 | Izawa |
| 2014/0218546 A1 | 8/2014 | McMahon |
| 2014/0232822 A1 | 8/2014 | Venkataraman et al. |
| 2014/0240528 A1 | 8/2014 | Venkataraman et al. |
| 2014/0240529 A1 | 8/2014 | Venkataraman et al. |
| 2014/0253738 A1 | 9/2014 | Mullis |
| 2014/0267243 A1 | 9/2014 | Venkataraman et al. |
| 2014/0267286 A1 | 9/2014 | Duparre |
| 2014/0267633 A1 | 9/2014 | Venkataraman et al. |
| 2014/0267762 A1 | 9/2014 | Mullis et al. |
| 2014/0267890 A1 | 9/2014 | Lelescu et al. |
| 2014/0285675 A1 | 9/2014 | Mullis |
| 2014/0321712 A1 | 10/2014 | Ciurea et al. |
| 2014/0333731 A1 | 11/2014 | Venkataraman et al. |
| 2014/0333764 A1 | 11/2014 | Venkataraman et al. |
| 2014/0333787 A1 | 11/2014 | Venkataraman et al. |
| 2014/0340539 A1 | 11/2014 | Venkataraman et al. |
| 2014/0347509 A1 | 11/2014 | Venkataraman et al. |
| 2014/0354773 A1 | 12/2014 | Venkataraman et al. |
| 2014/0354843 A1 | 12/2014 | Venkataraman et al. |
| 2014/0354844 A1 | 12/2014 | Venkataraman et al. |
| 2014/0354853 A1 | 12/2014 | Venkataraman et al. |
| 2014/0354854 A1 | 12/2014 | Venkataraman et al. |
| 2014/0354855 A1 | 12/2014 | Venkataraman et al. |
| 2014/0355870 A1 | 12/2014 | Venkataraman et al. |
| 2014/0368662 A1 | 12/2014 | Venkataraman et al. |
| 2014/0368683 A1 | 12/2014 | Venkataraman et al. |
| 2014/0368684 A1 | 12/2014 | Venkataraman et al. |
| 2014/0368685 A1 | 12/2014 | Venkataraman et al. |
| 2014/0369612 A1 | 12/2014 | Venkataraman et al. |
| 2014/0369615 A1 | 12/2014 | Venkataraman et al. |
| 2014/0376825 A1 | 12/2014 | Venkataraman et al. |
| 2014/0376826 A1 | 12/2014 | Venkataraman et al. |

FOREIGN PATENT DOCUMENTS

| | | |
|---|---|---|
| JP | 2006033493 A | 2/2006 |
| JP | 2007520107 A | 7/2007 |
| JP | 2011109484 A | 6/2011 |
| JP | 2013526801 A | 6/2013 |
| JP | 2014521117 A | 8/2014 |
| WO | 2007083579 A1 | 7/2007 |
| WO | 2008108271 A1 | 9/2008 |
| WO | 2009151903 A2 | 12/2009 |
| WO | 2011063347 A2 | 5/2011 |
| WO | 2011116203 A1 | 9/2011 |
| WO | 2011063347 A3 | 10/2011 |
| WO | 2011143501 A1 | 11/2011 |

(56) References Cited

FOREIGN PATENT DOCUMENTS

| | | |
|---|---|---|
| WO | 2012057619 A1 | 5/2012 |
| WO | 2012057620 A2 | 5/2012 |
| WO | 2012057621 A1 | 5/2012 |
| WO | 2012057622 A1 | 5/2012 |
| WO | 2012057623 A1 | 5/2012 |
| WO | 2012057620 A3 | 6/2012 |
| WO | 2012074361 A1 | 6/2012 |
| WO | 2012078126 A1 | 6/2012 |
| WO | 2012082904 A1 | 6/2012 |
| WO | 2012155119 A1 | 11/2012 |
| WO | 2013003276 A1 | 1/2013 |
| WO | 2013043751 A1 | 3/2013 |
| WO | 2013043761 A1 | 3/2013 |
| WO | 2013049699 A1 | 4/2013 |
| WO | 2013055960 A1 | 4/2013 |
| WO | 2013119706 A1 | 8/2013 |
| WO | 2013126578 A1 | 8/2013 |
| WO | 2014052974 A2 | 4/2014 |
| WO | 2014032020 A3 | 5/2014 |
| WO | 2014078443 A1 | 5/2014 |
| WO | 2014130849 A1 | 8/2014 |
| WO | 2014133974 A1 | 9/2014 |
| WO | 2014138695 A1 | 9/2014 |
| WO | 2014138697 A1 | 9/2014 |
| WO | 2014144157 A1 | 9/2014 |
| WO | 2014145856 A1 | 9/2014 |
| WO | 2014149403 A1 | 9/2014 |
| WO | 2014150856 A1 | 9/2014 |
| WO | 2014159721 A1 | 10/2014 |
| WO | 2014159779 A1 | 10/2014 |
| WO | 2014160142 A1 | 10/2014 |
| WO | 2014164550 A2 | 10/2014 |
| WO | 2014164909 A1 | 10/2014 |
| WO | 2014165244 A1 | 10/2014 |

OTHER PUBLICATIONS

International Preliminary Report on Patentability for International Application PCT/US2013/027146, International Filing Date Feb. 21, 2013, Report Completed Apr. 2, 2013, 10 pages.
International Search Report and Written Opinion for International Application No. PCT/US13/46002, Search Completed Nov. 13, 2013, Mailed Nov. 29, 2013, 7 pgs.
International Search Report and Written Opinion for International Application No. PCT/US13/48772, Search Completed Oct. 21, 2013, Mailed Nov. 8, 2013, 6 pgs.
International Search Report and Written Opinion for International Application No. PCT/US13/56065, Search Completed Nov. 25, 2013, Mailed Nov. 26, 2013, 8 pgs.
International Search Report and Written Opinion for International Application No. PCT/US13/59991, Search Completed Feb. 6, 2014, Mailed Feb. 26, 2014, 8 pgs.
International Search Report and Written Opinion for International Application No. PCT/US2013/024987, Search Completed Mar. 27, 2013, Mailed Apr. 15, 2013, 14 pgs.
International Search Report and Written Opinion for International Application No. PCT/US2013/056502, Search Completed Feb. 18, 2014, Mailed Mar. 19, 2014, 7 pgs.
International Search Report and Written Opinion for International Application No. PCT/US2013/069932, International Filing Date Nov. 13, 2013, Search Completed Mar. 14, 2014, Mailed Apr. 14, 2014, 12 pgs.
International Search Report and Written Opinion for International Application PCT/US13/62720, report completed Mar. 25, 2014, Mailed Apr. 21, 2014, 9 Pgs.
International Search Report and Written Opinion for International Application PCT/US14/024903 report completed Jun. 12, 2014, Mailed, Jun. 27, 2014, 13 pgs.
International Search Report and Written Opinion for International Application PCT/US14/17766, report completed May 28, 2014, 9 Pgs.
International Search Report and Written Opinion for International Application PCT/US14/18084, report completed May 23, 2014, Mailed Jun. 10, 2014, 12 Pgs.
International Search Report and Written Opinion for International Application PCT/US14/22774 report completed Jun. 9, 2014, Mailed Jul. 14, 2014, 6 Pgs.
International Search Report and Written Opinion for International Application PCT/US14/24407, report completed Jun. 11, 2014, Mailed Jul. 8, 2014, 9 Pgs.
International Search Report and Written Opinion for International Application PCT/US14/25100, report completed Jul. 7, 2014, Mailed Aug. 7, 2014 5 Pgs.
International Search Report and Written Opinion for International Application PCT/US14/25904 report completed Jun. 10, 2014, Mailed Jul. 10, 2014, 6 Pgs.
International Search Report and Written Opinion for International Application PCT/US2014/022123, report completed Jun. 9, 2014, Mailed Jun. 25, 2014, 5 pgs.
International Search Report and Written Opinion for International Application PCT/US2014/024947, Report Completed Jul. 8, 2014, Mailed Aug. 5, 2014, 8 Pgs.
International Search Report and Written Opinion for International Application PCT/US2014/028447, report completed Jun. 30, 2014, Mailed Jul. 21, 2014, 8 Pgs.
International Search Report and Written Opinion for International Application PCT/US2014/030692, report completed Jul. 28, 2014, Mailed Aug. 27, 2014, 7 Pages.
International Search Report and Written Opinion for International Application PCT/US2014/23762, Report Completed May 30, 2014, Mailed Jul. 3, 2014, 6 Pgs.
IPRP for International Application No. PCT/US2012/059813, International Filing Date Oct. 11, 2012, Search Completed Apr. 15, 2014, 7 pgs.
International Search Report and Written Opinion for International Application PCT/US11/36349, mailed Aug. 22, 2011, 12 pgs.
International Search Report and Written Opinion for International Application No. PCT/US2011/64921, Report Completed Feb. 25, 2011, mailed Mar. 6, 2012, 17 pgs.
International Search Report and Written Opinion for International Application No. PCT/US2013/027146, completed Apr. 2, 2013, 12 pgs.
International Search Report and Written Opinion for International Application PCT/US14/18116, completed May 13, 2014, 12 pgs.
International Search Report and Written Opinion for International Application PCT/US14/22118, report completed Jun. 9, 2014, Mailed, Jun. 25, 2014, 5 pgs.
International Search Report and Written Opinion for International Application PCT/US2009/044687, completed Jan. 5, 2010, 9 pgs.
International Search Report and Written Opinion for International Application PCT/US2010/057661, completed Mar. 9, 2011, 14 pgs.
International Search Report and Written Opinion for International Application PCT/US2012/044014, completed Oct. 12, 2012, 15 pgs.
International Search Report and Written Opinion for International Application PCT/US2012/056151, completed Nov. 14, 2012, 10 pgs.
International Search Report and Written Opinion for International Application PCT/US2012/059813, completed Dec. 17, 2012, 8 pgs.
International Search Report and Written Opinion for International Application PCT/US2012/37670, Mailed Jul. 18, 2012, Search Completed Jul. 5, 2012, 9 pgs.
International Search Report and Written Opinion for International Application PCT/US2012/58093, completed Nov. 15, 2012, 12 pgs.
Office Action for U.S. Appl. No. 12/952,106, dated Aug. 16, 2012, 12 pgs.
Baker et al., "Limits on Super-Resolution and How to Break Them", IEEE Transactions on Pattern Analysis and Machine Intelligence, Sep. 2002, vol. 24, No. 9, pp. 1167-1183.
Bertero et al., "Super-resolution in computational imaging", Micron, 2003, vol. 34, Issues 6-7, 17 pgs.
Bishop et al., "Full-Resolution Depth Map Estimation from an Aliased Plenoptic Light Field", ACCV 2010, Part II, LNCS 6493, pp. 186-200.

(56) References Cited

OTHER PUBLICATIONS

Bishop et al., "Light Field Superresolution", Retrieved from http://home.eps.hw.ac.uk/~sz73/ICCP09/LightFieldSuperresolution.pdf, 9 pgs.

Bishop et al., "The Light Field Camera: Extended Depth of Field, Aliasing, and Superresolution", IEEE Transactions on Pattern Analysis and Machine Intelligence, May 2012, vol. 34, No. 5, pp. 972-986.

Borman, "Topics in Multiframe Superresolution Restoration", Thesis of Sean Borman, Apr. 2004, 282 pgs.

Borman et al, "Image Sequence Processing", Source unknown, Oct. 14, 2002, 81 pgs.

Borman et al., "Block-Matching Sub-Pixel Motion Estimation from Noisy, Under-Sampled Frames—An Empirical Performance Evaluation", Proc SPIE, Dec. 1998, 3653, 10 pgs.

Borman et al., "Image Resampling and Constraint Formulation for Multi-Frame Super-Resolution Restoration", Proc. SPIE, Jun. 2003, 5016, 12 pgs.

Borman et al., "Linear models for multi-frame super-resolution restoration under non-affine registration and spatially varying PSF", Proc. SPIE, May 2004, vol. 5299, 12 pgs.

Borman et al., "Nonlinear Prediction Methods for Estimation of Clique Weighting Parameters in NonGaussian Image Models", Proc. SPIE, 1998. 3459, 9 pgs.

Borman et al., "Simultaneous Multi-Frame MAP Super-Resolution Video Enhancement Using Spatio-Temporal Priors", Image Processing, 1999, ICIP 99 Proceedings, vol. 3, pp. 469-473.

Borman et al., "Super-Resolution from Image Sequences—A Review", Circuits & Systems, 1998, pp. 374-378.

Bose et al., "Superresolution and Noise Filtering Using Moving Least Squares", IEEE Transactions on Image Processing, date unknown, 21 pgs.

Boye et al., "Comparison of Subpixel Image Registration Algorithms", Proc. of SPIE-IS&T Electronic Imaging, vol. 7246, pp. 72460X-1-72460X-9.

Bruckner et al., "Artificial compound eye applying hyperacuity", Optics Express, Dec. 11, 2006, vol. 14, No. 25, pp. 12076-12084.

Bruckner et al., "Driving microoptical imaging systems towards miniature camera applications", Proc. SPIE, Micro-Optics, 2010, 11 pgs.

Bruckner et al., "Thin wafer-level camera lenses inspired by insect compound eyes", Optics Express, Nov. 22, 2010, vol. 18, No. 24, pp. 24379-24394.

Capel, "Image Mosaicing and Super-resolution", [online], Retrieved on Nov. 10, 2012. Retrieved from the Internet at URL:<http://citeseerx.ist.psu.edu/viewdoc/download?doi=10.1.1.226.2643&rep=rep1&type=pdf>, Title pg., abstract, table of contents, pp.1-263 (269 total pages).

Chan et al., "Extending the Depth of Field in a Compound-Eye Imaging System with Super-Resolution Reconstruction", Proceedings—International Conference on Pattern Recognition, 2006, vol. 3, pp. 623-626.

Chan et al., "Investigation of Computational Compound-Eye Imaging System with Super-Resolution Reconstruction", IEEE, ISASSP 2006, pp. 1177-1180.

Chan et al., "Super-resolution reconstruction in a computational compound-eye imaging system", Multidim Syst Sign Process, 2007, vol. 18, pp. 83-101.

Chen et al., "Interactive deformation of light fields", In Proceedings of SIGGRAPH I3D 2005, pp. 139-146.

Drouin et al., "Fast Multiple-Baseline Stereo with Occlusion", Proceedings of the Fifth International Conference on 3-D Digital Imaging and Modeling, 2005, 8 pgs.

Drouin et al., "Geo-Consistency for Wide Multi-Camera Stereo", Proceedings of the 2005 IEEE Computer Society Conference on Computer Vision and Pattern Recognition, 2005, 8 pgs.

Drouin et al., "Improving Border Localization of Multi-Baseline Stereo Using Border-Cut", International Journal of Computer Vision, Jul. 2009, vol. 83, Issue 3, 8 pgs.

Duparre et al., "Artificial apposition compound eye fabricated by micro-optics technology", Applied Optics, Aug. 1, 2004, vol. 43, No. 22, pp. 4303-4310.

Duparre et al., "Artificial compound eye zoom camera", Bioinspiration & Biomimetics, 2008, vol. 3, pp. 1-6.

Duparre et al., "Artificial compound eyes—different concepts and their application to ultra flat image acquisition sensors", MOEMS and Miniaturized Systems IV, Proc. SPIE 5346, Jan. 2004, pp. 89-100.

Duparre et al., "Chirped arrays of refractive ellipsoidal microlenses for aberration correction under oblique incidence", Optics Express, Dec. 26, 2005, vol. 13, No. 26, pp. 10539-10551.

Duparre et al., "Micro-optical artificial compound eyes", Bioinspiration & Biomimetics, 2006, vol. 1, pp. R1-R16.

Duparre et al., "Microoptical artificial compound eyes—from design to experimental verification of two different concepts", Proc. of SPIE, Optical Design and Engineering II, vol. 5962, pp. 59622A-1-59622A-12.

Duparre et al., "Microoptical Artificial Compound Eyes—Two Different Concepts for Compact Imaging Systems", 11th Microoptics Conference, Oct. 30-Nov. 2, 2005, 2 pgs.

Duparre et al., "Microoptical telescope compound eye", Optics Express, Feb. 7, 2005, vol. 13, No. 3, pp. 889-903.

Duparre et al., "Micro-optically fabricated artificial apposition compound eye", Electronic Imaging—Science and Technology, Prod. SPIE 5301, Jan. 2004, pp. 25-33.

Duparre et al., "Novel Optics/Micro-Optics for Miniature Imaging Systems", Proc. of SPIE, 2006, vol. 6196, pp. 619607-1-619607-15.

Duparre et al., "Theoretical analysis of an artificial superposition compound eye for application in ultra flat digital image acquisition devices", Optical Systems Design, Proc. SPIE 5249, Sep. 2003, pp. 408-418.

Duparre et al., "Thin compound-eye camera", Applied Optics, May 20, 3005, vol. 44, No. 15, pp. 2949-2956.

Duparre et al., "Ultra-Thin Camera Based on Artificial Apposistion Compound Eyes", 10th Microoptics Conference, Sep. 1-3, 2004, 2 pgs.

Fanaswala, "Regularized Super-Resolution of Multi-View Images", Retrieved on Nov. 10, 2012. Retrieved from the Internet at URL:<http://www.site.uottawa.ca/-edubois/theses/Fanaswala_thesis.pdf>, 163 pgs.

Farrell et al., "Resolution and Light Sensitivity Tradeoff with Pixel Size", Proceedings of the SPIE Electronic Imaging 2006 Conference, 2006, vol. 6069, 8 pgs.

Farsiu et al., "Advances and Challenges in Super-Resolution", International Journal of Imaging Systems and Technology, 2004, vol. 14, pp. 47-57.

Farsiu et al., "Fast and Robust Multiframe Super Resolution", IEEE Transactions on Image Processing, Oct. 2004, vol. 13, No. 10, pp. 1327-1344.

Farsiu et al., "Multiframe Demosaicing and Super-Resolution of Color Images", IEEE Transactions on Image Processing, Jan. 2006, vol. 15, No. 1, pp. 141-159.

Feris et al., "Multi-Flash Stereopsis: Depth Edge Preserving Stereo with Small Baseline Illumination", IEEE Trans on PAMI, 2006, 31 pgs.

Fife et al., "A 3D Multi-Aperture Image Sensor Architecture", Custom Integrated Circuits Conference, 2006, CICC '06, IEEE, pp. 281-284.

Fife et al., "A 3MPixel Multi-Aperture Image Sensor with 0.7Mu Pixels in 0.11Mu CMOS", ISSCC 2008, Session 2, Image Sensors & Technology, 2008, pp. 48-50.

Fischer et al., Optical System Design, 2nd Edition, SPIE Press, pp. 191-198.

Fischer et al, Optical System Design, 2nd Edition, SPIE Press, pp. 49-58.

Goldman et al., "Video Object Annotation, Navigation, and Composition", In Proceedings of UIST 2008, pp. 3-12.

Gortler et al., "The Lumigraph", In Proceedings of SIGGRAPH 1996, pp. 43-54.

Hacohen et al., "Non-Rigid Dense Correspondence with Applications for Image Enhancement", ACM Transactions on Graphics, 30, 4, 2011, pp. 70:1-70:10.

Hamilton, "JPEG File Interchange Format, Version 1.02", Sep. 1, 1992, 9 pgs.

(56) References Cited

OTHER PUBLICATIONS

Hardie, "A Fast Image Super-Algorithm Using an Adaptive Wiener Filter", IEEE Transactions on Image Processing, Dec. 2007, vol. 16, No. 12, pp. 2953-2964.
Hasinoff et al., "Search-and-Replace Editing for Personal Photo Collections", Computational Photography (ICCP) 2010, pp. 1-8.
Horisaki et al., "Irregular Lens Arrangement Design to Improve Imaging Performance of Compound-Eye Imaging Systems", Applied Physics Express, 2010, vol. 3, pp. 022501-1-022501-3.
Horisaki et al., "Superposition Imaging for Three-Dimensionally Space-Invariant Point Spread Functions", Applied Physics Express, 2011, vol. 4, pp. 112501-1-112501-3.
Horn et al., "LightShop: Interactive Light Field Manipulation and Rendering", In Proceedings of I3D 2007, pp. 121-128.
Isaksen et al., "Dynamically Reparameterized Light Fields", In Proceedings of SIGGRAPH 2000, pp. 297-306.
Jarabo et al., "Efficient Propagation of Light Field Edits", In Proceedings of SIACG 2011, pp. 75-80.
Joshi et al., "Synthetic Aperture Tracking: Tracking Through Occlusions", I CCV IEEE 11th International Conference on Computer Vision; Publication [online]. Oct. 2007 [retrieved Jul. 28, 2014]. Retrieved from the Internet: >URL:http:l/ieeexplore.ieee.org/stamp/stamp.jsp?tp=&arnumber=4409032& isnumber=4408819>; pp. 1-8.
Kang et al., "Handling Occlusions inn Dense Multi-View Stereo", Computer Vision and Pattern Recognition, 2001, vol. 1, pp. I-103-I-110.
Kitamura et al., "Reconstruction of a high-resolution image on a compound-eye image-capturing system", Applied Optics, Mar. 10, 2004, vol. 43, No. 8, pp. 1719-1727.
Krishnamurthy et al., "Compression and Transmission of Depth Maps for Image-Based Rendering", Image Processing, 2001, pp. 828-831.
Kutulakos et al., "Occluding Contour Detection Using Affine Invariants and Purposive Viewpoint Control", Proc., CVPR 94, 8 pgs.
LensVector, "How LensVector Autofocus Works", printed Nov. 2, 2012 from http://www.lensvector.com/overview.html, 1 pg.
Levoy, "Light Fields and Computational Imaging", IEEE Computer Society, Aug. 2006, pp. 46-55.
Levoy et al., "Light Field Rendering", Proc. ADM SIGGRAPH '96, pp. 1-12.
Li et al., "A Hybrid Camera for Motion Deblurring and Depth Map Super-Resolution," Jun. 23-28, 2008, IEEE Conference on Computer Vision and Pattern Recognition, 8 pgs. Retrieved from www.eecis.udel.edu/~jye/lab_research/08/deblur-feng.pdf on Feb. 5, 2014.
Liu et al., "Virtual View Reconstruction Using Temporal Information", 2012 IEEE International Conference on Multimedia and Expo, 2012, pp. 115-120.
Lo et al., "Stereoscopic 3D Copy & Paste", ACM Transactions on Graphics, vol. 29, No. 6, Article 147, Dec. 2010, pp. 147:1-147:10.
Muehlebach, "Camera Auto Exposure Control for VSLAM Applications", Studies on Mechatronics, Swiss Federal Institute of Technology Zurich, Autumn Term 2010 course, 67 pgs.
Nayar, "Computational Cameras: Redefining the Image", IEEE Computer Society, Aug. 2006, pp. 30-38.
Ng, "Digital Light Field Photography", Thesis, Jul. 2006, 203 pgs.
Ng et al., "Super-Resolution Image Restoration from Blurred Low-Resolution Images", Journal of Mathematical Imaging and Vision, 2005, vol. 23, pp. 367-378.
Nitta et al., "Image reconstruction for thin observation module by bound optics by using the iterative backprojection method", Applied Optics, May 1, 2006, vol. 45, No. 13, pp. 2893-2900.
Nomura et al., "Scene Collages and Flexible Camera Arrays", Proceedings of Eurographics Symposium on Rendering, 2007, 12 pgs.
Park et al., "Super-Resolution Image Reconstruction", IEEE Signal Processing Magazine, May 2003, pp. 21-36.
Pham et al., "Robust Super-Resolution without Regularization", Journal of Physics: Conference Series 124, 2008, pp. 1-19.
Polight, "Designing Imaging Products Using Reflowable Autofocus Lenses", http://www.polight.no/tunable-polymer-autofocus-lens-html--11.html.
Protter et al., "Generalizing the Nonlocal-Means to Super-Resolution Reconstruction", IEEE Transactions on Image Processing, Jan. 2009, vol. 18, No. 1, pp. 36-51.
Radtke et al., "Laser lithographic fabrication and characterization of a spherical artificial compound eye", Optics Express, Mar. 19, 2007, vol. 15, No. 6, pp. 3067-3077.
Rander et al., "Virtualized Reality: Constructing Time-Varying Virtual Worlds From Real World Events", Proc. of IEEE Visualization '97, Phoenix, Arizona, Oct. 19-24, 1997, pp. 277-283, 552.
Rhemann et al, "Fast Cost-Volume Filtering for Visual Correspondence and Beyond", IEEE Trans. Pattern Anal. Mach. Intell, 2013, vol. 35, No. 2, pp. 504-511.
Robertson et al., "Dynamic Range Improvement Through Multiple Exposures", In Proc. of the Int. Conf. on Image Processing, 1999, 5 pgs.
Robertson et al., "Estimation-theoretic approach to dynamic range enhancement using multiple exposures", Journal of Electronic Imaging, Apr. 2003, vol. 12, No. 2, pp. 219-228.
Roy et al., "Non-Uniform Hierarchical Pyramid Stereo for Large Images", Computer and Robot Vision, 2007, pp. 208-215.
Sauer et al., "Parallel Computation of Sequential Pixel Updates in Statistical Tomographic Reconstruction", ICIP 1995, pp. 93-96.
Seitz et al., "Plenoptic Image Editing", International Journal of Computer Vision 48, 2, pp. 115-129.
Shum et al., "Pop-Up Light Field: An Interactive Image-Based Modeling and Rendering System," Apr. 2004, ACM Transactions on Graphics, vol. 23, No. 2, pp. 143-162. Retrieved from http://131.107.65.14/en-us/um/people/jiansun/papers/PopupLightField_TOG.pdf on Feb. 5.
Stollberg et al., "The Gabor superlens as an alternative wafer-level camera approach inspired by superposition compound eyes of nocturnal insects", Optics Express, Aug. 31, 2009, vol. 17, No. 18, pp. 15747-15759.
Sun et al., "Image Super-Resolution Using Gradient Profile Prior", Source and date unknown, 8 pgs.
Takeda et al., "Super-resolution Without Explicit Subpixel Motion Estimation", IEEE Transaction on Image Processing, Sep. 2009, vol. 18, No. 9, pp. 1958-1975.
Tanida et al., "Color imaging with an integrated compound imaging system", Optics Express, Sep. 8, 2003, vol. 11, No. 18, pp. 2109-2117.
Tanida et al., "Thin observation module by bound optics (TOMBO): concept and experimental verification", Applied Optics, Apr. 10, 2001, vol. 40, No. 11, pp. 1806-1813.
Taylor, "Virtual camera movement: The way of the future?", American Cinematographer 77, (Sep. 9), 93-100.
Vaish et al., "Reconstructing Occluded Surfaces Using Synthetic Apertures: Stereo, Focus and Robust Measures", Proceeding, CVPR '06 Proceedings of the 2006 IEEE Computer Society Conference on Computer Vision and Pattern Recognition—vol. 2, pp. 2331-2338.
Vaish et al., "Synthetic Aperture Focusing Using a Shear-Warp Factorization of the Viewing Transform", IEEE Workshop on A3DISS, CVPR, 2005, 8 pgs.
Vaish et al., "Using Plane + Parallax for Calibrating Dense Camera Arrays", IEEE Conference on Computer Vision and Pattern Recognition (CVPR), 2004, 8 pgs.
Veilleux, "CCD Gain Lab: The Theory", University of Maryland, College Park—Observational Astronomy (ASTR 310), Oct. 19, 2006, pp. 1-5 (online), [retrieved on May 13, 2014]. Retrieved from the Internet <URL:http://www.astro.umd.edu/~veilleux/ASTR310/fall06/ccd_theory.pdf, 5 pgs.
Vuong et al., "A New Auto Exposure and Auto White-Balance Algorithm to Detect High Dynamic Range Conditions Using CMOS Technology", Proceeding of the World Congress on Engineering and Computer Science 2008, WCECS 2008, Oct. 22-24, 2008.
Wang, "Calculation of Image Position, Size and Orientation Using First Order Properties", 10 pgs.
Wetzstein et al., "Computational Plenoptic Imaging", Computer Graphics Forum, 2011, vol. 30, No. 8, pp. 2397-2426.
Wheeler et al., "Super-Resolution Image Synthesis Using Projections Onto Convex Sets in the Frequency Domain", Proc. SPIE, 2005, 5674, 12 pgs.

(56) References Cited

OTHER PUBLICATIONS

Wikipedia, "Polarizing Filter (Photography)", http://en.wikipedia.org/wiki/Polarizing_filter_(photography), 1 pg.

Wilburn, "High Performance Imaging Using Arrays of Inexpensive Cameras", Thesis of Bennett Wilburn, Dec. 2004, 128 pgs.

Wilburn et al., "High Performance Imaging Using Large Camera Arrays", ACM Transactions on Graphics, Jul. 2005, vol. 24, No. 3, pp. 765-776.

Wilburn et al., "High-Speed Videography Using a Dense Camera Array", Proceeding, CVPR'04 Proceedings of the 2004 IEEE Computer Society Conference on Computer Vision and Pattern Recognition, pp. 294-301.

Wilburn et al., "The Light Field Video Camera", Proceedings of Media Processors 2002, SPIE Electronic Imaging, 2002, 8 pgs.

Wippermann et al., "Design and fabrication of a chirped array of refractive ellipsoidal micro-lenses for an apposition eye camera objective", Proceedings of SPIE, Optical Design and Engineering II, Oct. 15, 2005, 59622C-1-59622C-11.

Yang et al., "A Real-Time Distributed Light Field Camera", Eurographics Workshop on Rendering (2002), pp. 1-10.

Yang et al., "Superresolution Using Preconditioned Conjugate Gradient Method", Source and date unknown, 8 pgs.

Zhang et al., "A Self-Reconfigurable Camera Array", Eurographics Symposium on Rendering, 2004, 12 pgs.

Zomet et al., "Robust Super-Resolution", IEEE, 2001, pp. 1-6.

* cited by examiner

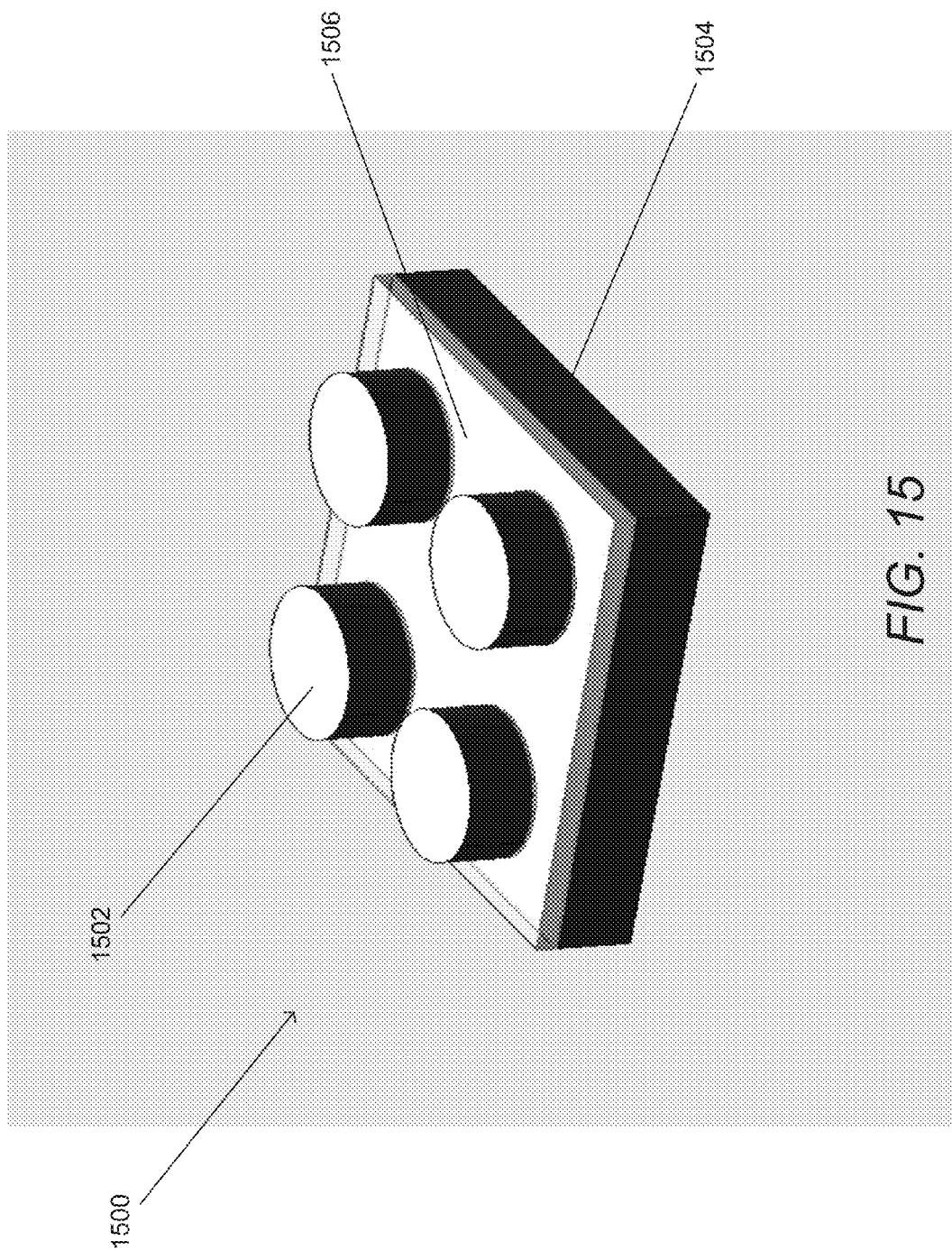

ARRAY CAMERAS INCORPORATING INDEPENDENTLY ALIGNED LENS STACKS

CROSS-REFERENCE TO RELATED APPLICATIONS

The current application is a continuation of U.S. patent application Ser. No. 14/536,537 entitled "Methods of Manufacturing Array Camera Modules Incorporating Independently Aligned Lens Stacks" to Rodda et al., filed Nov. 7, 2014, which application claims priority under 35 U.S.C. §119(e) to U.S. Provisional Patent Application Ser. No. 61/901,378 entitled "Non-Monolithic 3-3 Array Module with Discrete Sensors and Discrete Lenses" to Rodda et al., filed Nov. 7, 2013 and U.S. Provisional Patent Application Ser. No. 61/904,947 entitled "Array Camera Modules and Methods of Manufacturing Array Camera Modules Incorporating Independently Aligned Lens Stacks" to Rodda et al., filed Nov. 15, 2013. The disclosures of U.S. Provisional Patent Application Ser. Nos. 61/901,378 and 61/904,947 are hereby incorporated by reference in their entirety.

FIELD OF THE INVENTION

The present application relates generally to array cameras and more specifically to array cameras incorporating independently aligned lens stacks and physically discrete sensors forming an array, a single focal plane sensor utilizing a virtual array, or a monolithic sensor having multiple physical focal planes.

BACKGROUND

Imaging devices, such as cameras, can be used to capture images of portions of the electromagnetic spectrum, such as the visible light spectrum, incident upon an image sensor. For ease of discussion, the term light is generically used to cover radiation across the entire electromagnetic spectrum. In a typical imaging device, light enters through an opening (aperture) at one end of the imaging device and is directed to an image sensor by one or more optical elements such as lenses. The image sensor includes pixels or sensor elements that generate signals upon receiving light via the optical element. Commonly used image sensors include charge-coupled device (CCDs) sensors and complementary metal-oxide semiconductor (CMOS) sensors.

Image sensors are devices capable of converting an optical image into a digital signal. Image sensors utilized in digital cameras are made up of an array of pixels. Each pixel in an image sensor is capable of capturing light and converting the captured light into electrical signals. In order to separate the colors of light and capture a color image, a Bayer filter is often placed over the image sensor, filtering the incoming light into its red, blue, and green (RGB) components which are then captured by the image sensor. The RGB signal captured by the image sensor plus Bayer filter can then be processed and a color image can be created.

Generally, image capture utilizes a single image sensor, to capture individual images, one at a time. A digital camera typically combines both an image sensor and processing capabilities. When the digital camera takes a photograph, the data captured by the image sensor is provided to the processor by the image sensor. Processors are able to control aspects of a captured image by changing image capture parameters of the sensor elements or groups of sensor elements used to capture the image.

SUMMARY OF THE INVENTION

Systems and methods in accordance with embodiments of the invention include processes for constructing array camera modules, array camera modules, and array cameras that include multiple lens stacks separately mounted to a carrier.

One embodiment includes: forming at least one hole in at least one carrier; mounting the at least one carrier relative to at least one sensor so that light passing through the at least one hole in the at least one carrier is incident on a plurality of focal planes formed by arrays of pixels on the at least one sensor; independently mounting a plurality of lens barrels to the at least one carrier, so that a lens stack in each lens barrel directs light through the at least one hole in the at least one carrier and focuses the light onto one of the plurality of focal planes; and mounting a module cap over the lens barrels, where the module cap includes at least one opening that admits light into the lens stacks contained within the plurality of lens barrels.

In a further embodiment, forming at least one hole in at least one carrier includes forming at least one hole in a single carrier.

In another embodiment, mounting the single carrier relative to at least one sensor includes mounting the single carrier relative to a plurality of sensors.

In a still further embodiment, each of the plurality of sensors is mounted to a first side of the single carrier; each of the plurality of lens barrels is mounted to a second opposite side of the single carrier; and the plurality of sensors comprises a separate sensor for each of the plurality of lens barrels.

In still another embodiment, the at least one hole in the single carrier are spaced to enable an active alignment tool to grip the lens barrel during the active alignment process.

In a yet further embodiment, flip chip mounting is utilized to mount the plurality of sensors to the single carrier.

In yet another embodiment, the plurality of sensors is mounted to a substrate and mounting the single carrier relative to the plurality of sensors comprises mounting the single carrier in a fixed location relative to the substrate.

In a further embodiment again, the plurality of sensors is positioned proximate a first side of the single carrier and each of the plurality of lens barrels is mounted to a second opposite side of the single carrier.

In another embodiment again, the at least one hole in the single carrier are spaced to enable an active alignment tool to grip the lens barrel during the active alignment process.

In a further additional embodiment, mounting the single carrier relative to at least one sensor includes mounting the single carrier relative to a single sensor.

In another additional embodiment, the single sensor is mounted to a first side of the single carrier; and each of the plurality of lens barrels is mounted to a second opposite side of the single carrier.

In a still yet further embodiment, the at least one hole in the single carrier are spaced to enable an active alignment tool to grip the lens barrel during the active alignment process.

In still yet another embodiment, flip chip mounting is utilized to mount the single sensor to the single carrier.

In a still further embodiment again, the single sensor is mounted to a substrate and mounting the single carrier relative to the single sensor comprises mounting the single carrier in a fixed location relative to the substrate.

In still another embodiment again, the single sensor is positioned proximate a first side of the single carrier and each of the plurality of lens barrels is mounted to a second opposite side of the single carrier.

In a still further additional embodiment, the at least one hole in the single carrier are spaced to enable an active alignment tool to grip the lens barrel during the active alignment process.

In still another additional embodiment, forming at least one hole in at least one carrier comprises forming a ledge in at least one hole in the at least one carrier and mounting at least one spectral filter on the ledge.

A yet further embodiment again also includes mounting at least one spectral filter within at least one hole in the at least one carrier.

In yet another embodiment again, the at least one spectral filter is selected from the group consisting of a color filter and an IR-cut filter.

A further additional embodiment again also includes mounting an interface device relative to the at least one carrier.

In another additional embodiment again, the interface device is mounted to the carrier.

In another further embodiment, the at least one sensor and the interface device are mounted to a substrate and mounting the at least one carrier relative to the at least one sensor comprises mounting the at least one carrier in a fixed location relative to the substrate.

In still another further embodiment, independently mounting a plurality of lens barrels to the at least one carrier comprises using active alignment to separately mount each of the lens barrels to one of the at least one carrier.

In yet another further embodiment, the at least one hole in the at least one carrier are spaced to enable an active alignment tool to grip the lens barrel during the active alignment process.

In another further embodiment again, the at least one opening in the module cap are dimensioned so that the module cap is not visible within the field of view of any of the lens stacks and so that light does not reflect from the module cap into the lens stacks.

In another further additional embodiment, the module cap is mounted to the at least one carrier so that a small air gap exists between the module cap and the top of the lens barrels and the method further comprises applying a small bead of adhesive to each of the lens barrels to seal the air gap between the module cap and the lens barrels.

In still another further embodiment again, the carrier is constructed from a material selected from the group consisting of ceramic and glass.

Still another further additional embodiment includes: forming a plurality of holes in carrier; mounting the carrier relative to a plurality of sensors so that light passing through each of the plurality of holes in the carrier is incident on one of a plurality of focal planes formed by the plurality of sensors; mounting at least one spectral filter within at least one of the plurality of holes in the carrier; independently mounting a plurality of lens barrels to the carrier, so that a lens stack in each lens barrel directs light through the at least one hole in the at least one carrier and focuses the light onto a focal plane formed by a corresponding sensor in the plurality of sensors; and mounting a module cap over the lens barrels so that the module cap is attached to the carrier and a small air gap exists between the module cap and the top of the lens barrels, where the module cap includes a plurality of openings that each admits light into one of the plurality lens stacks contained within the plurality of lens barrels; and applying a small bead of adhesive to each of the lens barrels to seal the air gap between the module cap and the lens barrels.

An array camera module in accordance with an embodiment of the invention includes at least one carrier in which at least one window is formed; at least one sensor mounted relative to the at least one carrier so that light passing through the at least one window in the at least one carrier is incident on a plurality of focal planes formed by at least one array of pixels on the at least one sensor; a plurality of lens barrels mounted to the at least one carrier, so that a lens stack in each lens barrel directs light through the at least one window in the at least one carrier and focuses the light onto one of the plurality of focal planes; and a module cap mounted over the lens barrels, where the module cap includes at least one opening that admits light into the lens stacks contained within the plurality of lens barrels.

In a further embodiment, the at least one carrier is a single carrier.

In another embodiment, each of the plurality of sensors is mounted to a first side of the single carrier; each of the plurality of lens barrels is mounted to a second opposite side of the single carrier; and the plurality of sensors comprises a separate sensor for each of the plurality of lens barrels.

In a still further embodiment, the plurality of sensors is mounted to a substrate and the single carrier is mounted in a fixed location relative to the substrate; and the plurality of sensors is positioned proximate a first side of the single carrier and each of the plurality of lens barrels is mounted to a second opposite side of the single carrier.

In still another embodiment, the at least one sensor is a single sensor.

In a yet further embodiment, the single sensor is mounted to a first side of the single carrier; and each of the plurality of lens barrels is mounted to a second opposite side of the single carrier.

In yet another embodiment, the single sensor is mounted to a substrate and the single carrier is mounted in a fixed location relative to the substrate; and the single sensor is positioned proximate a first side of the single carrier and each of the plurality of lens barrels is mounted to a second opposite side of the single carrier.

In a further embodiment again, the at least one sensor is mounted to a substrate and each of a plurality of carriers is mounted in a fixed location relative to the substrate; and each of the plurality of lens barrels is mounted to a separate carrier.

In another embodiment again, each lens barrel forms a separate aperture.

In a further additional embodiment, each lens barrel and corresponding focal plane forms a camera; different cameras within the array camera module image different parts of the electromagnetic spectrum; and the lens stacks contained within the lens barrels differ depending upon the portion of the electromagnetic spectrum imaged by the camera to which the lens barrel belongs.

In another additional embodiment, the lens stacks contained within the lens barrels differ with respect to at least one of: the materials used to construct the lens elements within the lens stacks; the shapes of at least one surface of corresponding lens elements in the lens stacks.

In a still further embodiment again, each lens stack in the lens barrels has a field of view that focuses light so that the plurality of arrays of pixels that form the focal planes sample the same object space within a scene.

In still another embodiment again, the pixel arrays of the focal planes define spatial resolutions for each pixel array; the lens stacks focus light onto the focal planes so that the plurality of arrays of pixels that form the focal planes sample the same object space within a scene with sub-pixel offsets that provide sampling diversity; and the lens stacks have modulation transfer functions that enable contrast to be resolved at a spatial frequency corresponding to a higher resolution than the spatial resolutions of the pixel arrays.

In a yet further embodiment again, at least one window in the at least one carrier includes a spectral filter.

In yet another embodiment again, at least one window in at least one carrier comprises a ledge on which the at least one spectral filter is mounted.

In a still further additional embodiment, the at least one spectral filter is selected from the group consisting of a color filter and an IR-cut filter.

In still another additional embodiment, at least one spectral filter is applied to an array of pixels forming a focal plane on at least one of the sensors.

In a yet further additional embodiment, at least one lens stack includes at least one spectral filter.

In yet another additional embodiment, the plurality of lens barrels and the plurality of focal planes form an M×N array of cameras.

In a still further additional embodiment again, the plurality of lens barrels and the plurality of focal planes form a 3×3 array of cameras.

In still another additional embodiment again, the M×N array of cameras comprises a 3×3 group of cameras including: a central reference camera; four cameras that capture image data in a first color channel located in the four corners of the 3×3 group of cameras; a pair of cameras that capture image data in a second color channel located on either side of the central reference camera; and a pair of cameras that capture image data in a third color channel located on either side of the central reference camera.

In another further embodiment, the reference camera is selected from the group consisting of: a camera including a Bayer filter; and a camera that captures image data in the first color channel.

Still another further embodiment also includes an interface device in communication with the at least one sensor, where the interface device multiplexes data received from the at least one sensor and provides an interface via which multiplexed data is read and the imaging parameters of the focal planes formed by the at least one pixel array on the at least one sensor are controlled.

In yet another further embodiment, the interface device is mounted to the carrier and the carrier includes circuit traces that carry signals between the interface device and the at least one sensor; and a common clock signal coordinates the capture of image data by the at least one sensor and readout of the image data from the at least one sensor via the interface device.

In another further embodiment again, the at least one sensor and the interface device are mounted to a substrate, which includes circuit traces that carry signals between the interface device and the at least one sensor; the at least one carrier is mounted in a fixed location relative to the at least one sensor; and a common clock signal coordinates the capture of image data by the at least one sensor and readout of the image data from the at least one sensor via the interface device.

In another further additional embodiment, the module cap is mounted to the at least one carrier so that a small air gap exists between the module cap and the top of the lens barrels and a small bead of adhesive seals the air gaps between the module cap and the lens barrels.

In still yet another further embodiment, the carrier is constructed from a material selected from the group consisting of ceramic and glass.

Still another further embodiment again includes: a carrier in which a plurality of windows are formed; a plurality of sensors each including an array of pixels, where the plurality of sensors are mounted relative to the carrier so that light passing through the plurality of windows is incident on a plurality of focal planes formed by the arrays of pixels; a plurality of lens barrels mounted to the at least one carrier so that a lens stack in each lens barrel directs light through the at least one window in the at least one carrier and focuses the light onto one of the plurality of focal planes; and a module cap mounted over the lens barrels, where the module cap includes at least one opening that admits light into the lens stacks contained within the plurality of lens barrels.

An embodiment of an array camera includes: a processor; memory containing an image capture application; an array camera module, comprising: at least one carrier in which at least one window is formed; at least one sensor mounted relative to the at least one carrier so that light passing through the at least one window in the at least one carrier is incident on a plurality of focal planes formed by at least one array of pixels on the at least one sensor; a plurality of lens barrels mounted to the at least one carrier, so that a lens stack in each lens barrel directs light through the at least one window in the at least one carrier and focuses the light onto one of the plurality of focal planes; and a module cap mounted over the lens barrels, where the module cap includes at least one opening that admits light into the lens stacks contained within the plurality of lens barrels. In addition, the image capture application directs the processor to: trigger the capture of image data by the array camera module; obtain and store image data captured by the array camera module, where the image data forms a set of images captured from different viewpoints; select a reference viewpoint relative to the viewpoints of the set of images captured from different viewpoints; normalize the set of images to increase the similarity of corresponding pixels within the set of images; determine depth estimates for pixel locations in an image from the reference viewpoint using at least a subset of the set of images, wherein generating a depth estimate for a given pixel location in the image from the reference viewpoint comprises: identifying pixels in the at least a subset of the set of images that correspond to the given pixel location in the image from the reference viewpoint based upon expected disparity at a plurality of depths; comparing the similarity of the corresponding pixels identified at each of the plurality of depths; and selecting the depth from the plurality of depths at which the identified corresponding pixels have the highest degree of similarity as a depth estimate for the given pixel location in the image from the reference viewpoint.

In a further embodiment, each lens barrel forms a separate aperture.

In another embodiment, the lens stacks contained within the lens barrels differ with respect to at least one of: the materials used to construct the lens elements within the lens stacks; the shapes of at least one surface of corresponding lens elements in the lens stacks.

In a still further embodiment, the image capture application further directs the processor to fuse pixels from the set of images using the depth estimates to create a fused image having a resolution that is greater than the resolutions of the images in the set of images by: determining the visibility of the pixels in the set of images from the reference viewpoint by: identifying corresponding pixels in the set of images using the depth estimates; and determining that a pixel in a given image is not visible in the reference viewpoint when the pixel fails a photometric similarity criterion determined based upon a comparison of corresponding pixels; and applying scene dependent geometric shifts to the pixels from the set of images that are visible in an image from the reference viewpoint to shift the pixels into the reference viewpoint, where the scene dependent geometric shifts are determined using the current depth estimates; and fusing the shifted pixels from the set of images to create a fused image from the reference viewpoint having a resolution that is greater than the resolutions of the images in the set of images.

In a yet further embodiment, the image capture application further directs the processor to synthesize an image from the reference viewpoint by performing a super-resolution process based upon the fused image from the reference viewpoint, the set of images captured from different viewpoints, the current depth estimates, and visibility information.

In yet another embodiment, the plurality of images comprises image data in multiple color channels; and the image capture application directs the processor to compare the similarity of pixels that are identified as corresponding at each of the plurality of depths by comparing the similarity of the pixels that are identified as corresponding in each of a plurality of color channels at each of the plurality of depths.

In a further embodiment again, the array camera module further comprises an interface device in communication with the at least one sensor, where the interface device multiplexes data received from the sensors and provides an interface via which the processor reads multiplexed data and via which the processor controls the imaging parameters of the focal planes formed by the plurality of pixel arrays.

In another embodiment again, the interface device is mounted to the carrier and the carrier includes circuit traces that carry signals between the interface device and the at least one sensor; and a common clock signal coordinates the capture of image data by the at least one sensor and readout of the image data from the at least one sensor via the interface device.

In a further embodiment again, the at least one sensor and the interface device are mounted to a substrate, which includes circuit traces that carry signals between the interface device and the at least one sensor; the at least one carrier is mounted in a fixed location relative to the at least one sensor; and a common clock signal coordinates the capture of image data by the at least one sensor and readout of the image data from the at least one sensor via the interface device.

Another further embodiment includes: a processor; memory containing an image capture application; an array camera module, comprising: a carrier in which a plurality of windows are formed; a plurality of sensors each including an array of pixels, where the plurality of sensors are mounted relative to the carrier so that light passing through the plurality of windows is incident on a plurality of focal planes formed by the arrays of pixels; a plurality of lens barrels mounted to the at least one carrier so that a lens stack in each lens barrel directs light through the at least one window in the at least one carrier and focuses the light onto one of the plurality of focal planes; and a module cap mounted over the lens barrels, where the module cap includes at least one opening that admits light into the lens stacks contained within the plurality of lens barrels. In addition, the image capture application directs the processor to: trigger the capture of image data by the array camera module; obtain and store image data captured by the array camera module, where the image data forms a set of images captured from different viewpoints; select a reference viewpoint relative to the viewpoints of the set of images captured from different viewpoints; normalize the set of images to increase the similarity of corresponding pixels within the set of images; determine depth estimates for pixel locations in an image from the reference viewpoint using at least a subset of the set of images. Furthermore, generating a depth estimate for a given pixel location in the image from the reference viewpoint includes: identifying pixels in the at least a subset of the set of images that correspond to the given pixel location in the image from the reference viewpoint based upon expected disparity at a plurality of depths; comparing the similarity of the corresponding pixels identified at each of the plurality of depths; and selecting the depth from the plurality of depths at which the identified corresponding pixels have the highest degree of similarity as a depth estimate for the given pixel location in the image from the reference viewpoint.

In still another further embodiment, the pixel arrays of the focal planes define spatial resolutions for each pixel array; the lens stacks focus light onto the focal planes so that the plurality of arrays of pixels that form the focal planes sample the same object space within a scene with sub-pixel offsets that provide sampling diversity; and the lens stacks have modulation transfer functions that enable contrast to be resolved at a spatial frequency corresponding to a higher resolution than the spatial resolutions of the pixel arrays; and the image capture application further directs the processor to fuse pixels from the set of images using the depth estimates to create a fused image having a resolution that is greater than the resolutions of the images in the set of images by: determining the visibility of the pixels in the set of images from the reference viewpoint by: identifying corresponding pixels in the set of images using the depth estimates; and determining that a pixel in a given image is not visible in the reference viewpoint when the pixel fails a photometric similarity criterion determined based upon a comparison of corresponding pixels; and applying scene dependent geometric shifts to the pixels from the set of images that are visible in an image from the reference viewpoint to shift the pixels into the reference viewpoint, where the scene dependent geometric shifts are determined using the current depth estimates; and fusing the shifted pixels from the set of images to create a fused image from the reference viewpoint having a resolution that is greater than the resolutions of the images in the set of images.

BRIEF DESCRIPTION OF THE DRAWINGS

FIG. 15 conceptually illustrates an array camera module in which a single sensor is attached to a glass carrier in accordance with an embodiment of the invention.

DETAILED DESCRIPTION

Figure 1:
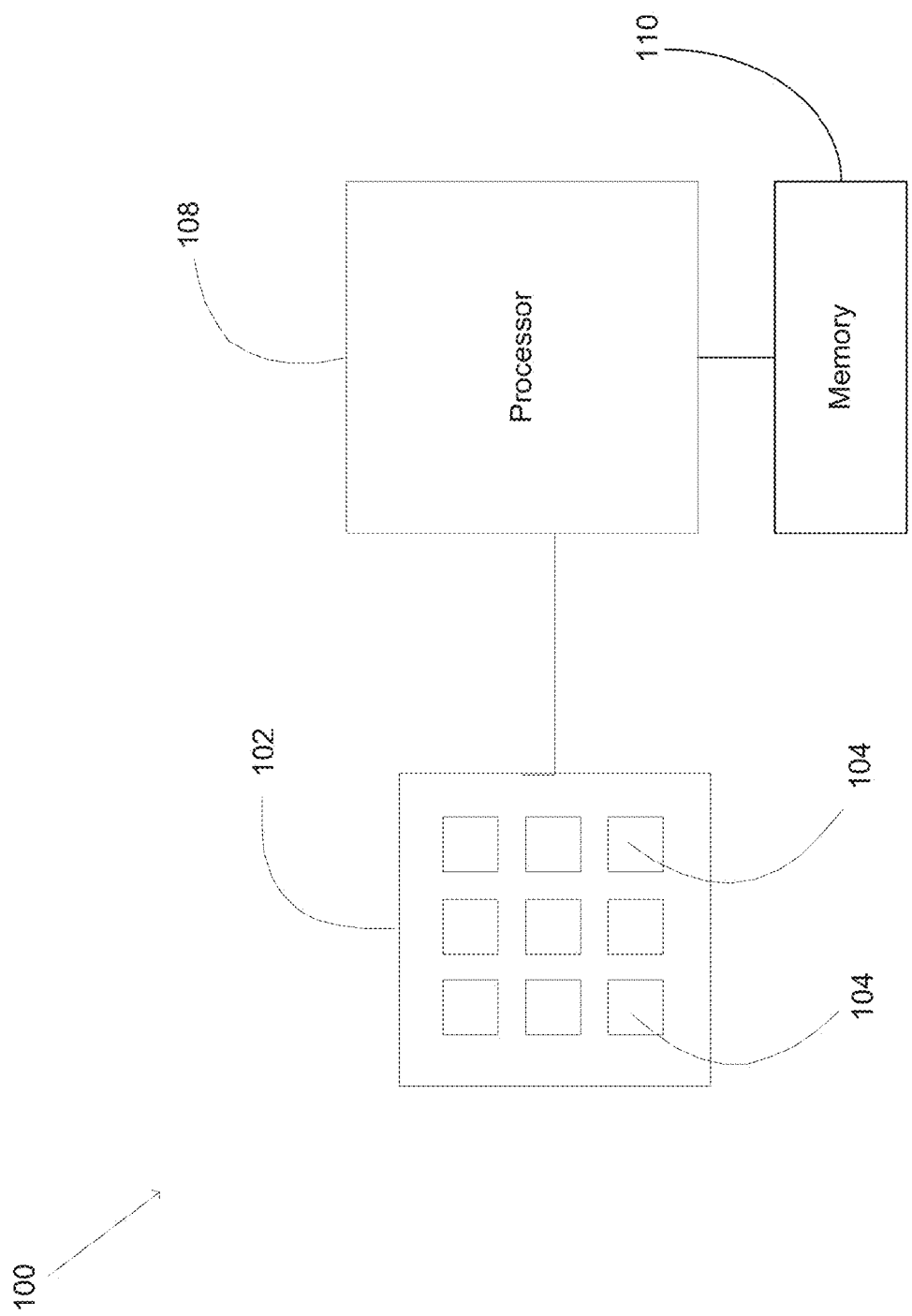
FIG. 1 conceptually illustrates an array camera in accordance with an embodiment of the invention.

Turning now to the drawings, array camera modules incorporating independently aligned lens stacks and methods for constructing array camera modules incorporating independently aligned lens stacks are described. An array camera is an image capture device that includes multiple lens stacks or optical channels that direct light onto a corresponding number of focal planes, enabling the capture of multiple images of a scene using the focal planes. The light received via each of the lens stacks passes through a separate aperture and so each of the captured images constitutes a different view of the scene. In a number of embodiments, super-resolution processes such as those described in U.S. Patent Publication No. 2012/0147205 entitled "Systems and Methods for Synthesizing High Resolution Images Using Super-Resolution Processes", to Lelescu et al., are utilized to synthesize a higher resolution two dimensional (2D) image or a stereo pair of higher resolution 2D images from the lower resolution images in the light field captured by an array camera. The terms high or higher resolution and low or lower resolution are used here in a relative sense and not to indicate the specific resolutions of the images captured by the array camera. The disclosure within U.S. Patent Publication No. 2012/0147205 concerning processes for fusing higher resolution images from a set of images captured from different viewpoints, synthesizing higher resolution images from a set of images captured from different viewpoints using super-resolution processing, synthesizing high resolution images from virtual viewpoints, and for dynamically refocusing synthesized high resolution images is hereby incorporated by reference in its entirety.

The term focal plane can be used to describe a region on a sensor containing an array of pixel elements configured to capture an image based upon light directed onto the focal plane via a lens stack or optical channel. In many embodiments, each focal plane is implemented using a separate sensor. In a number of embodiments, array cameras are implemented using sensors that include multiple focal planes, where each focal plane receives light from a separate optical channel. As such, the sensor is configured to separately and (in many instances) independently capture and output image data from each of the focal planes.

The array cameras disclosed in U.S. Patent Publication No. 2011/0069189 entitled "Capturing and Processing of Images Using Monolithic Camera Array with Heterogeneous Imagers", to Venkataraman et al. include examples of array cameras in which the lens stacks of the array camera are implemented as a single lens stack array that is aligned and mounted to a sensor. However, the large number of tolerances involved in the manufacture of a lens stack array can result in the different optical channels having varying focal lengths. The combination of all the manufacturing process variations typically results in a deviation of the actual ("first order") lens parameters—such as focal length—from the nominal prescription. As a result, each optical channel can have a different axial optimum image location. Consequently, the lens stack array typically cannot be placed a distance that corresponds with the focal length of each lens stack within an array camera module. Notably, these manufacturing tolerances may result in different focal lengths even as between lens stack arrays fabricated from the same manufacturing process. The disclosure within U.S. Patent Publication No. 2011/0069189 regarding the implementation of different array camera architectures including monolithic array cameras, non-monolithic array cameras, and arrays of array cameras is hereby incorporated by reference herein in its entirety. Array cameras in accordance with embodiments of the invention are constructed by independently aligning each lens stack with respect to a corresponding focal plane. In this way, each lens stack can be optimally aligned with respect to a corresponding focal plane.

In several embodiments, an active alignment process is utilized to align each lens stack with respect to its corresponding focal plane. In the context of the manufacture of camera systems, the term active alignment typically refers to a process for aligning an optical system (e.g. a lens stack array) with an imaging system (e.g. comprising a monolithic sensor) to achieve a final desirable spatial arrangement by evaluating the efficacy of the configuration as a function of the spatial relationship between the optical system and the imaging system. Typically, this process is implemented by using the configuration to capture and record image data (typically of a known target) in real time as the optical system is moving relative to the imaging system. As the optical system is moved relative to the imaging system, the spatial relationship between the two changes, and the characteristics of the recorded image data also change correspondingly. This recorded image data may then be used to align the optical system relative to the imaging system in a desired manner. For example, active alignment can generally be used to determine a spatial relationship that results in a camera that is capable of recording images that exceed a threshold image quality.

In several embodiments, an array camera module is constructed using a ceramic carrier in which windows through the ceramic carrier are formed. A single sensor or multiple sensors can be fixed to one side of the ceramic carrier to form the focal planes of the array camera module and lens barrels containing lens stacks can be affixed to the other side of the ceramic carrier so that the lens stacks direct light onto the focal planes of the one or more sensors through the openings in the ceramic carrier. The ceramic carrier is rigid and can have a co-efficient of thermal expansion (CTE) selected to match the CTE of the sensor. In this way, the ceramic carrier reduces the likelihood that mismatches in thermal expansion will result in changes in the alignment between the lens stacks and corresponding focal planes that deteriorate the quality of the images that can be synthesized using the image data captured by the focal planes. In other embodiments, any of a variety of substrate materials exhibiting rigidity and low CTE can be utilized as a substitute for a ceramic carrier including (but not limited to) a transparent glass substrate. Furthermore, a variety of mounting techniques can be utilized including (but not limited to) mounting one or more sensors to a substrate and mounting the lens barrels containing the lens stacks to a carrier, or mounting individual camera modules to a substrate. Array cameras constructed using array camera modules incorporating independently aligned lens stacks and methods for constructing array camera modules incorporating independently aligned lens stacks are discussed further below.

Array Cameras Including Modules Incorporating Independently Aligned Lens Stacks

An array camera including an array camera module in accordance with an embodiment of the invention is illustrated in FIG. 1. The array camera 100 includes an array camera module 102 including an array of cameras 104. The array camera module 102 is configured to communicate with a processor 108, which can execute an image capture application stored as non-transitory machine readable instructions within a memory 110. The memory 110 can also be utilized to store image data captured by the array camera module.

The array camera module 102 includes an array of focal planes on which images are formed by an array of lens stacks. Each lens stack creates an optical channel that forms an image of the scene on an array of light sensitive pixels within a corresponding focal plane. Each lens stack is independently mounted within array camera module 102 to form a single camera 104 with the corresponding focal plane on which the lens stack forms an image. In many embodiments, each lens stack can be actively aligned with respect to its corresponding focal plane to improve the quality of the image data capture by the focal plane.

The pixels within a focal plane of a camera 104 generate image data that can be sent from the array of cameras 104 to the processor 108. In many embodiments, the lens stack within each optical channel have fields of view that focus light so that pixels of each focal plane sample the same object space or region within the scene. In several embodiments, the lens stacks are configured so that the pixels that sample the same object space do so with sub-pixel offsets to provide sampling diversity that can be utilized to recover increased resolution through the use of super-resolution processes. The term sampling diversity refers to the fact that the images from different viewpoints sample the same object in the scene but with slight sub-pixel offsets. By processing the images with sub-pixel precision, additional information encoded due to the sub-pixel offsets can be recovered when compared to simply sampling the object space with a single image. In order to enable the recovery of higher resolution information, the lens stacks are designed to have a Modulation Transfer Function (MTF) that enables contrast to be resolved at a spatial frequency corresponding to the higher resolution and not at the spatial resolution of the pixels that form a focal plane.

In the illustrated embodiment, the cameras 104 are configured in a 3×3 array. In other embodiments, any of a variety of M×N camera array configurations can be utilized including linear arrays (i.e. 1×N arrays). Each camera 104 in the array camera module 102 is capable of capturing an image of the scene. The sensor elements utilized in the focal planes of the cameras 104 can be individual light sensing elements such as, but not limited to, traditional CIS (CMOS Image Sensor) pixels, CCD (charge-coupled device) pixels, high dynamic range sensor elements, multispectral sensor elements and/or any other structure configured to generate an electrical signal indicative of light incident on the structure. In many embodiments, the sensor elements of each focal plane have similar physical properties and receive light via the same optical channel and color filter (where present). In several embodiments, the sensor elements have different characteristics and, in many instances, the characteristics of the sensor elements are related to the color filter applied to each sensor element.

In a variety of embodiments, color filters in individual cameras can be used to pattern the camera module with π filter groups as further discussed in U.S. Patent Publication No. 2013/0293760 entitled "Camera Modules Patterned with pi Filter Groups", the disclosure from which related to filter patterns that can be utilized in the implementation of an array camera is incorporated by reference herein in its entirety. Any of a variety of color filter configurations can be utilized where cameras in each color channel are distributed on either side of the center of the camera. The cameras can be used to capture data with respect to different colors, or a specific portion of the spectrum. In a number of embodiments, cameras image in the near-IR, IR, and/or far-IR spectral bands. In contrast to applying color filters to the pixels of the camera, color filters in many embodiments of the invention are mounted to a ceramic carrier to which one or more sensors and/or the lens stacks are mounted, or included in the lens stack. Where the sensor(s) and lens stacks are mounted to a glass substrate, the color filters can be applied to the glass substrate. For example, a green color camera can include a lens stack with a green light filter that allows green light to pass through the optical channel. In many embodiments, the pixels in each focal plane are the same and the light information captured by the pixels is differentiated by the color filters in the corresponding lens stack for each filter plane. The inclusion of spectral filters within array camera modules in accordance with various embodiments of the invention can be implemented in a variety of other ways including (but not limited to) by applying color filters to the pixels of the focal planes of the cameras similar to the manner in which color filters are applied to the pixels of a conventional color camera. In several embodiments, at least one of the cameras in the camera module can include uniform color filters applied to the pixels in its focal plane. In many embodiments, a Bayer filter pattern is applied to the pixels of at least one of the cameras in a camera module. In a number of embodiments, camera modules are constructed in which color filters are utilized in both the lens stacks and on the pixels of the imager array.

In several embodiments, the processor 108 is configured to take the image data captured by the sensor and synthesize high resolution images. In a number of embodiments, the processor 108 is configured to measure distances to or depth of objects in the scene using the set of images captured by the array camera module. In many embodiments, the process of synthesizing high resolution images from a set of images captured by the array camera module also involves generating depth information with respect to objects visible within the field of view of the array camera. U.S. Pat. No. 8,619,082 entitled "Systems and Methods for Parallax Detection and Correction in Images Captured Using Array Cameras that Contain Occlusions using Subsets of Images to Perform Depth Estimation" to Ciurea et al. discloses techniques for estimating depth using sets of images captured from different viewpoints. The disclosure within U.S. Pat. No. 8,619,082 concerning estimating depth and generating a depth map using multiple images of a scene and synthesizing images from different perspectives using depth information is also incorporated by reference herein in its entirety. In many embodiments of the invention, the process of estimating depth and/or synthesizing a higher resolution image of a scene from a set of images involves selection of a reference viewpoint, typically that of a reference camera.

In many embodiments, a set of images is created using the image data captured by the cameras in the array camera module and can be considered to be a number of images of the scene captured from different viewpoints. In order to assist with depth estimation and/or synthesis of higher resolution images, the set of images can be normalized to increase the similarity of corresponding pixels within the images. In several embodiments, the process of estimating depth and/or building a depth map of the scene from the reference viewpoint involves determining depth estimates for pixel locations in an image from the reference viewpoint using at least a subset of the set of images, wherein generating a depth estimate for a given pixel location in the image from the reference viewpoint includes: identifying pixels in the at least a subset of the set of images that correspond to the given pixel location in the image from the reference viewpoint based upon expected disparity at a plurality of depths; comparing the similarity of the corresponding pixels identified at each of the plurality of depths; and selecting the depth from the plurality of depths at which the identified corresponding pixels have the highest degree of similarity as a depth estimate for the given pixel location in the image from the reference viewpoint. When the array camera module captures image data in multiple color channels, the array camera can compare the similarity of pixels that are identified as corresponding at each of the plurality of depths by comparing the similarity of the pixels that are identified as corresponding in each of the color channels at each of the plurality of depths. These processes are discussed in more detail in U.S. Pat. No. 8,619,082, the relevant disclosure of which is incorporated by reference herein and above by reference in its entirety.

In a number of embodiments, a higher resolution image is synthesized from the set of images obtained from the array camera module by fusing pixels from the set of images using the depth estimates to create a fused image having a resolution that is greater than the resolutions of the images in the set of images. The fusion process can include: identifying the pixels from the set of images that are visible in an image from the reference viewpoint using the at least one visibility map; applying scene dependent geometric shifts to the pixels from the set of images that are visible in an image from the reference viewpoint to shift the pixels into the reference viewpoint, where the scene dependent geometric shifts are determined using the current depth estimates; and fusing the shifted pixels from the set of images to create a fused image from the reference viewpoint having a resolution that is greater than the resolutions of the images in the set of images. In several embodiments, the process of synthesizing a higher resolution image involves performing an additional super-resolution process based upon the fused image from the reference viewpoint, the set of images captured from different viewpoints, the current depth estimates, and the visibility information. The fusion and super-resolution processes are described in more detail in U.S. Patent Publication No. 2012/0147205 the relevant disclosure of which is incorporated by reference herein and above in its entirety.

In many embodiments, the processor 108 is able to synthesize an image from a virtual viewpoint. In a number of embodiments, a virtual viewpoint is any viewpoint which is not the reference viewpoint. In several embodiments, the virtual viewpoint corresponds to a viewpoint of one of the cameras 104 in the array camera module 102 that is not the reference camera. In many embodiments, the processor is able to synthesize an image from a virtual viewpoint, which does not correspond to any camera 104 in the array camera module 102.

Although specific array camera architectures are described above with respect to FIG. 1, alternative architectures can also be utilized in accordance with embodiments of the invention. Array camera modules including independently aligned lens stacks in accordance with embodiments of the invention and discussed further below.

Array Camera Modules

Array camera modules incorporating independently aligned lens stacks can offer a variety of benefits including (but not limited to) capturing image data using focal planes that are located at the back focal length of their corresponding lens stacks. In addition, array camera modules constructed in accordance with many embodiments of the invention interpose materials between sensors and lens barrels containing the lens stacks that reduce the impact of CTE mismatch between the low CTE semiconductor materials from which the sensors are fabricated and the higher CTE materials from which the lens barrels are constructed. Accordingly, array camera modules can be constructed that achieve precise alignment of optics and robustness to variations in thermal conditions.

Figure 2A:
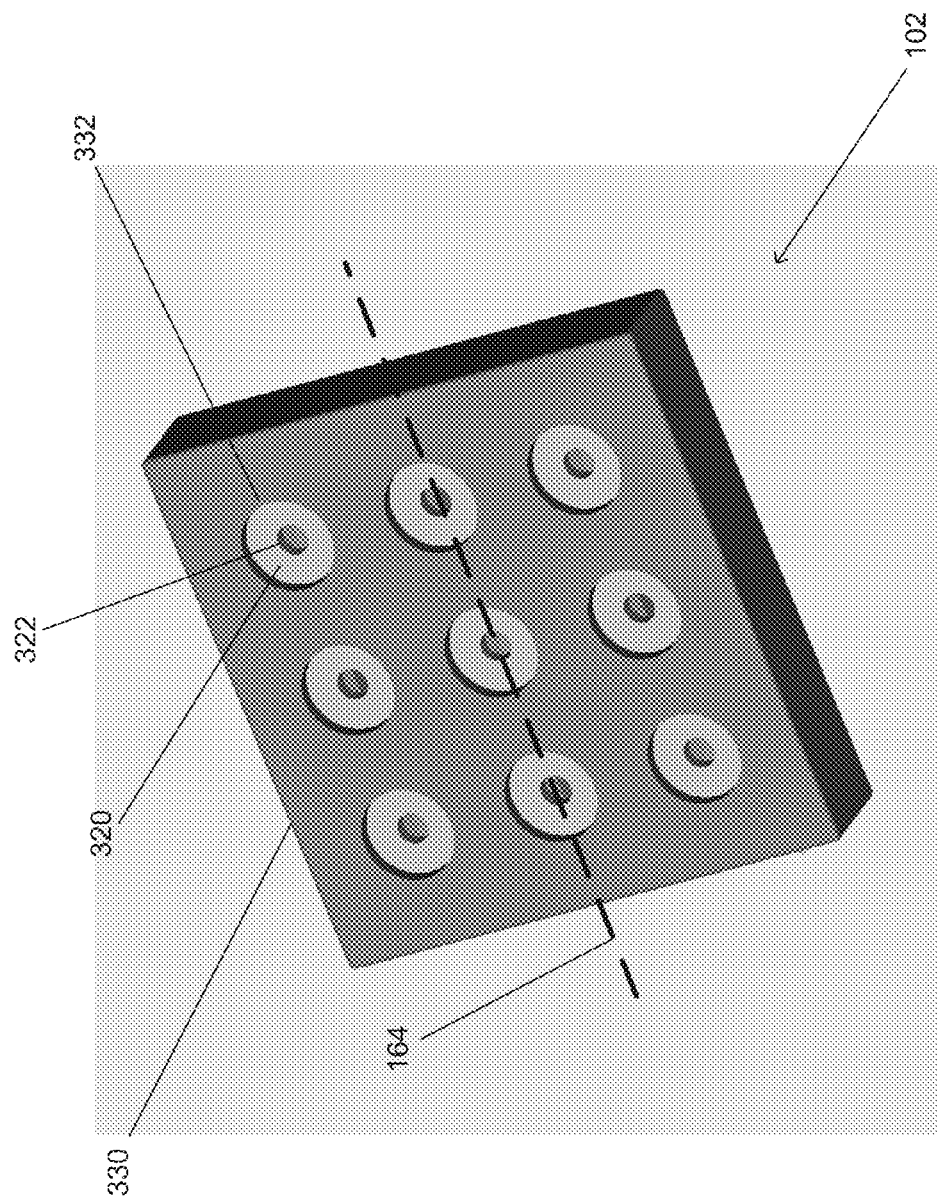
FIGS. 2A-2C schematically illustrate an array camera module in accordance with an embodiment of the invention.
Figure 2B:
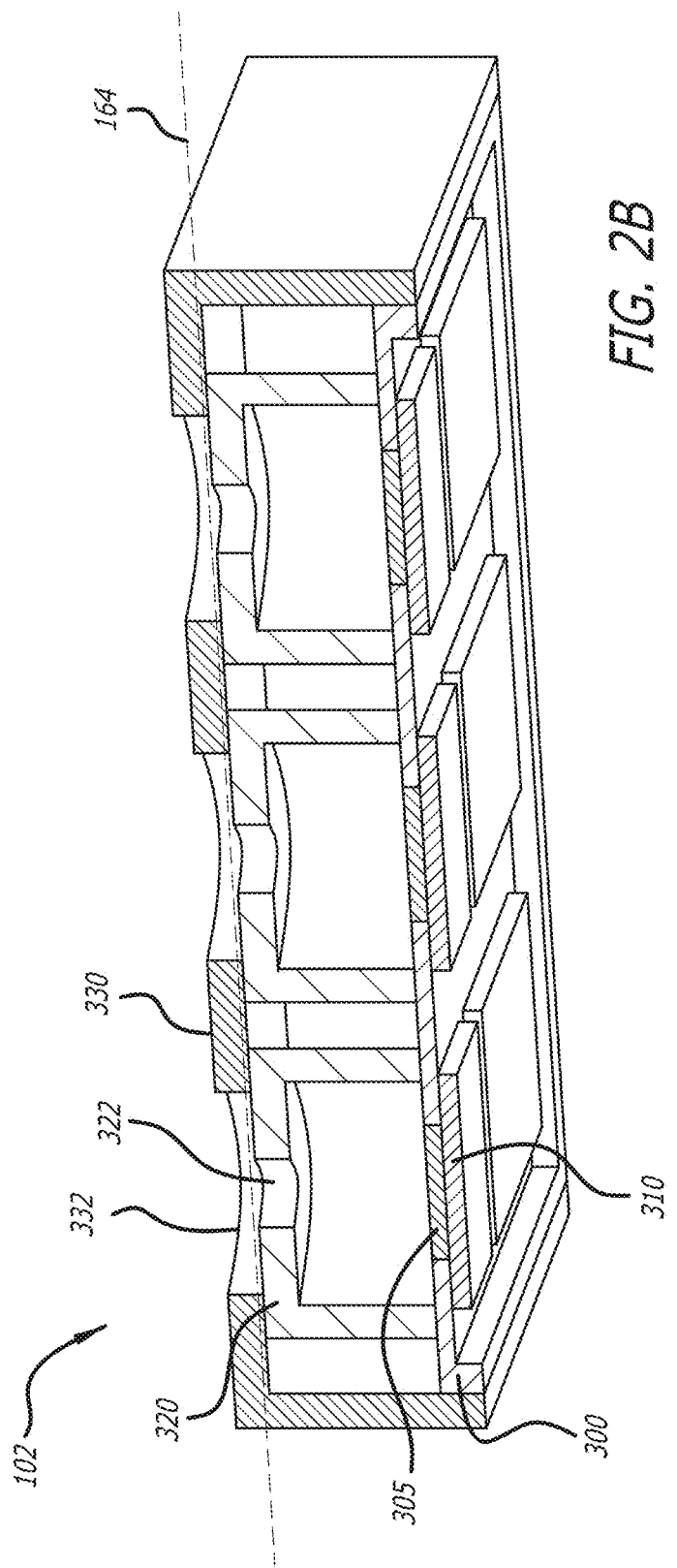
Figure 2C:
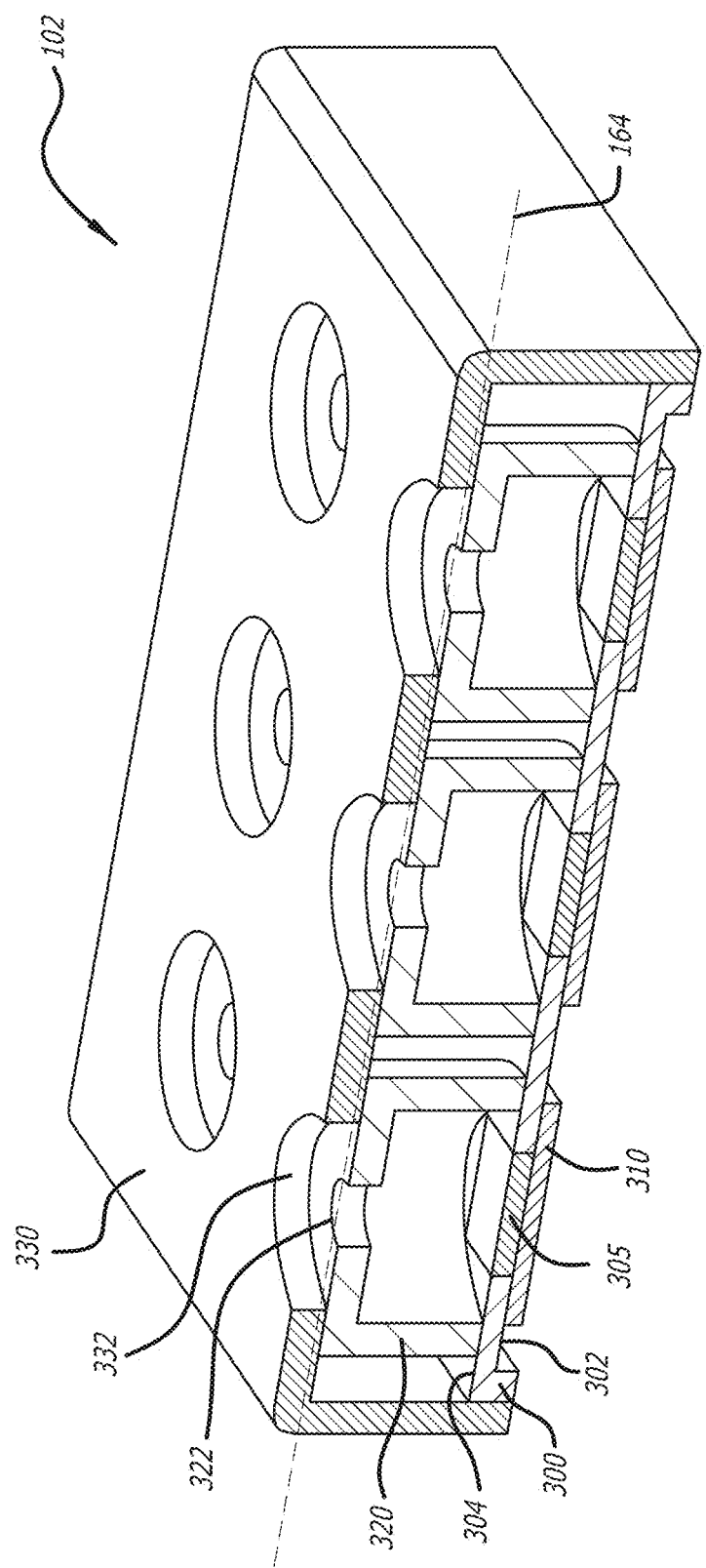
Figure 3:
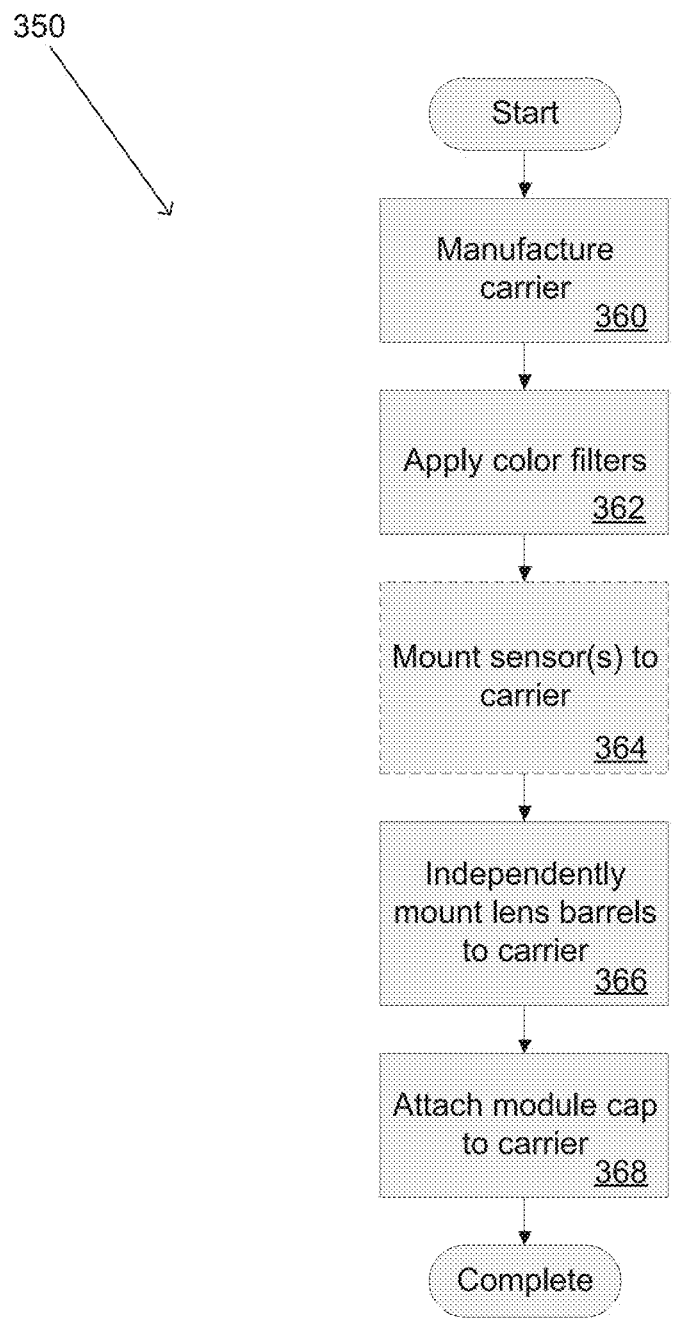
FIG. 3 is a flow chart illustrating a process for manufacturing an array camera module in accordance with an embodiment of the invention.
Figure 4:
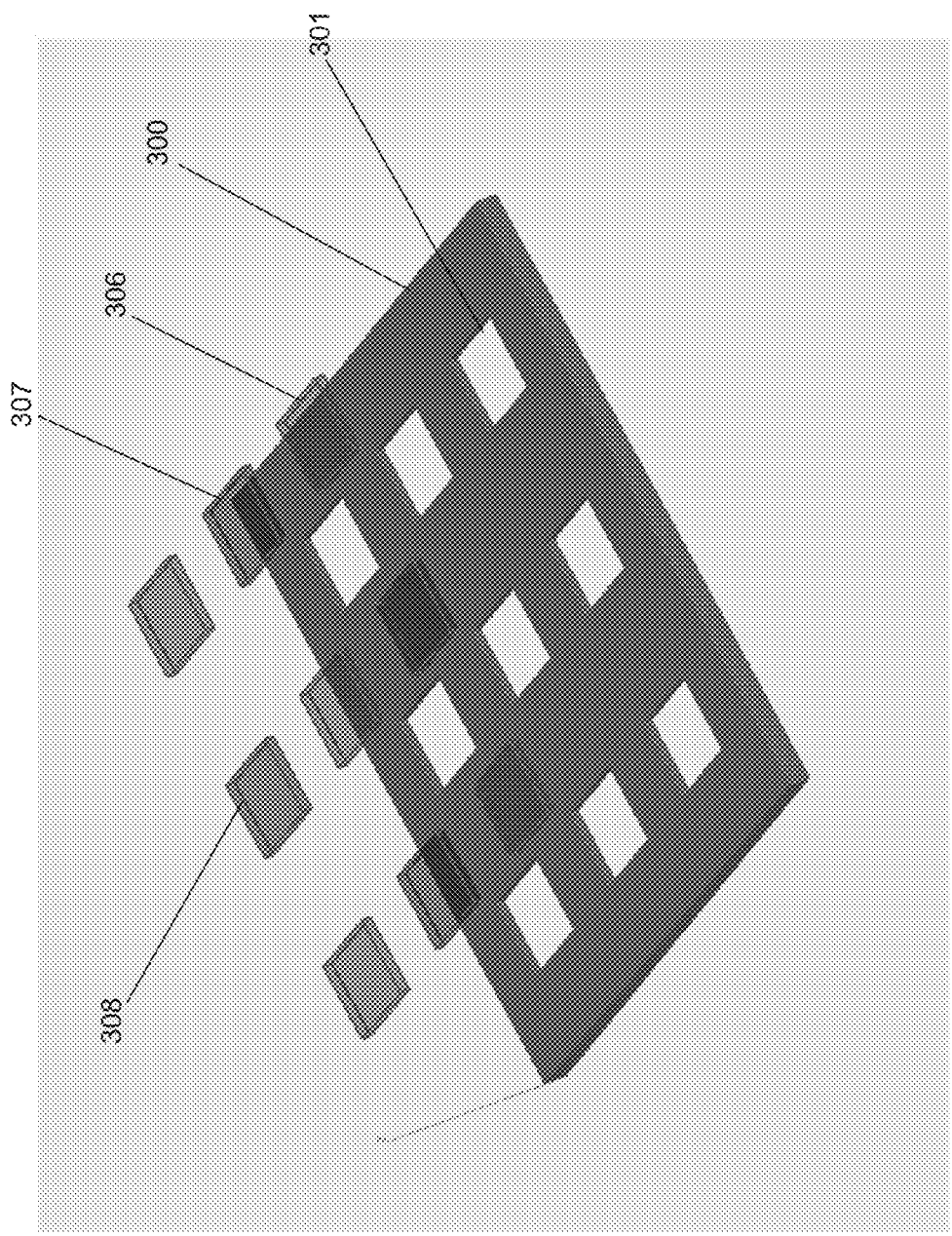
FIGS. 4 and 5 conceptually illustrate the mounting of filters to a carrier during the construction of an array camera module in accordance with an embodiment of the invention.
Figure 5:
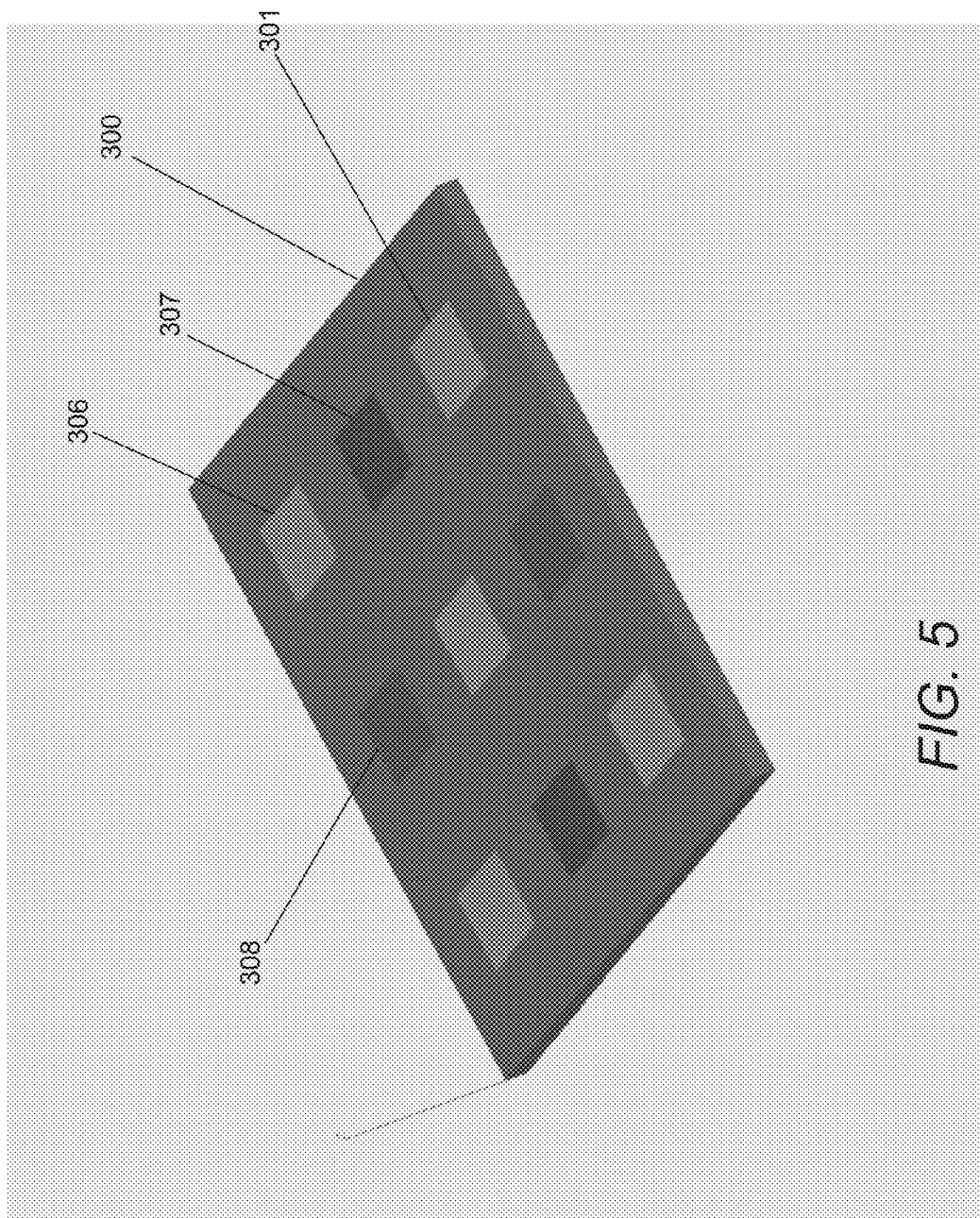
Figure 6:
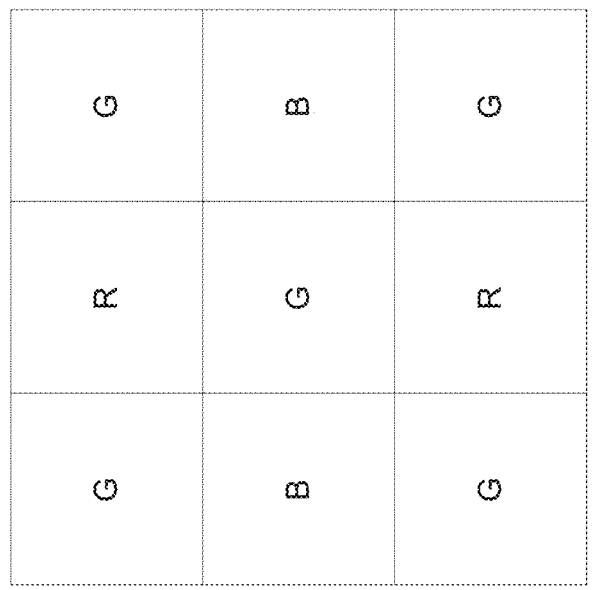
FIG. 6 conceptually illustrates cameras forming a π filter group in which red and blue cameras are located on either side of a central green camera that can serve as a reference camera.

An array camera module incorporating independently aligned lens stacks in accordance with an embodiment of the invention is illustrated in FIGS. 2A-2C. FIGS. 2B and 2C illustrate cross sections of an array camera module 102 illustrated in FIG. 2A taken along an axis 164. The array camera module 102 includes a carrier 300, which can be implemented using a ceramic carrier and/or any of a variety of materials possessing rigidity and low CTE that are appropriate to the requirements of a specific application. Windows extend from a first side 302 through to a second side 204 of the carrier 300. Windows can be holes and or transparent regions of the carrier. In the illustrated embodiment, the windows are rectangular holes and color filters and/or IR cut-off filters 305 are mounted within the opening of each hole. As discussed above, the inclusion of spectral filters in openings within the carrier is optional and spectral filters can be located within the lens barrels and/or on the sensor elements of the focal planes. At least one sensor 310 is mounted on the first side 302 of the carrier so that the sensor pixels are positioned facing inward to receive light that passes through the color filter 305 mounted within the carrier 300. In the illustrated embodiment, a single sensor is shown per camera. As noted above, a single sensor can form the focal planes of multiple cameras. In many embodiments, a single sensor forms the focal planes of all of the cameras in the array. In several embodiments, the single sensor includes a single array of pixels that is read out to capture an image from each of the optical channels formed by the lens barrels. In many embodiments, the single sensor includes a separate independently controllable array of pixels that form the focal planes of each of the cameras. A lens barrel 320 containing a lens stack is mounted on the second side 304 of the carrier 300. The lens barrel forms an aperture and each lens barrel 320 is positioned so that the outermost lens 322 of the lens stack contained within the lens barrel directs light into the lens stack. In many embodiments, cameras in the array camera module image different parts of the electromagnetic spectrum and the lens stacks contained within the lens barrels differ depending upon the color channel to which the camera belongs. In several embodiments, the surfaces of the lens elements, and/or the material used in the construction of the lens elements within the lens stacks differ based upon the portion of the spectrum imaged by a camera. A module cap 330 is fixed to the carrier 300 and extends over the lens barrels 320. In the illustrated embodiment, the outermost lens 322 contained within each lens barrel 320 receives light through an opening in the module cap 330. The openings in the module cap 330 can be dimensioned to avoid the module cap 330 from obscuring the fields of view of the lens stacks and/or reflecting light into the lens stacks.

In other embodiments, the module cap can include one or more cover glasses through which the lens barrels can receive light.

Although the array camera modules discussed above with respect to FIGS. 2A-2C utilize a separate sensor mounted to the carrier for each camera in the array camera module, a single sensor or multiple sensors incorporating more than one focal plane can be mounted to one side of carrier with a separate lens barrel for each camera mounted to the other side of the carrier. The sensor(s) need not be mounted to the same carrier as the lens barrels. The substrate to which the sensor(s) are mounted, whether the carrier or a separate substrate, can include circuit traces that provide power to the sensor(s) and enable read out of data. Furthermore, the sensor(s) can be mounted to a substrate and independent carriers can be utilized to mount the lens barrels to the sensor(s). In embodiments that utilize multiple sensors, the sensors can communicate with another device mounted to the substrate that multiplexes data received from the sensors and provides an interface via which a processor can read out multiplexed data and control the imaging parameters of the focal planes within the array camera module. Processes for constructing array camera modules in accordance with embodiments of the invention are discussed further below.

Manufacturing Array Camera Modules

A variety of processes can be utilized to construct array camera modules in accordance with embodiments of the invention and the specific processes that are utilized typically depend upon the materials utilized in the construction of the array camera module and the manner in which one or more sensors and/or each camera's lens barrel is mounted. In a number of embodiments, the process of manufacturing an array camera module includes independently actively aligning each lens barrel.

A process for manufacturing an array camera module utilizing a carrier to which one or more sensors and camera lens barrels are independently mounted using active alignment in accordance with an embodiment of the invention is illustrated in FIGS. 3-13. The process 350 includes manufacturing (360) a carrier. As noted above with respect to FIGS. 2A-2C, in many embodiments each camera is formed around a window in the carrier that enables a lens stack contained within a lens barrel to direct light onto the focal plane of a sensor. Furthermore, a color filter and/or an IR cut-off filter can be mounted within an opening in the carrier that forms window. Accordingly, the process of manufacturing the carrier includes forming the appropriate windows, which can involve forming holes through the carrier or applying light blocking masks to a transparent carrier to define transparent windows through the carrier. In several embodiments, ledges are formed within the holes to facilitate the mounting of color filters and/or IR cut-off filters within the hole.

Referring again to FIG. 3 and FIGS. 4 and 5, color filters and/or additional filters such as (but not limited to) IR cut-off filters can be mounted (362) so that light passes through the filters in order to pass from one side of the carrier through a window to the other side of the carrier. In the embodiment illustrated in FIGS. 4 and 5, green 306, blue 307, and red 308 color filters are inserted along with IR cut-off filters into holes 301 formed within the carrier 300. The carrier is configured to be incorporated into an array camera module containing nine cameras and green color filters are incorporated within five of the cameras, two cameras incorporate blue color filters 307 and two cameras incorporate red color filters 308. The configuration of the cameras forms the π filter group conceptually illustrated in FIG. 6 in which red and blue cameras are located equidistant and on either side of a central green camera that can serve as a reference camera. In other embodiments, any of a variety of filters applied in any of a variety of patterns can be utilized as appropriate to the requirements of specific applications. Furthermore, many applications do not involve the application of filters to the carrier. For example, an array camera module that includes one or more Bayer cameras can utilize one or more sensors to which color filters are directly applied. In many embodiments, the techniques described above are utilized to form a π filter group with a central Bayer camera or an array in which each camera is a Bayer camera. The specific selection of filters typically depends upon the requirements of a specific application.

Figure 7:
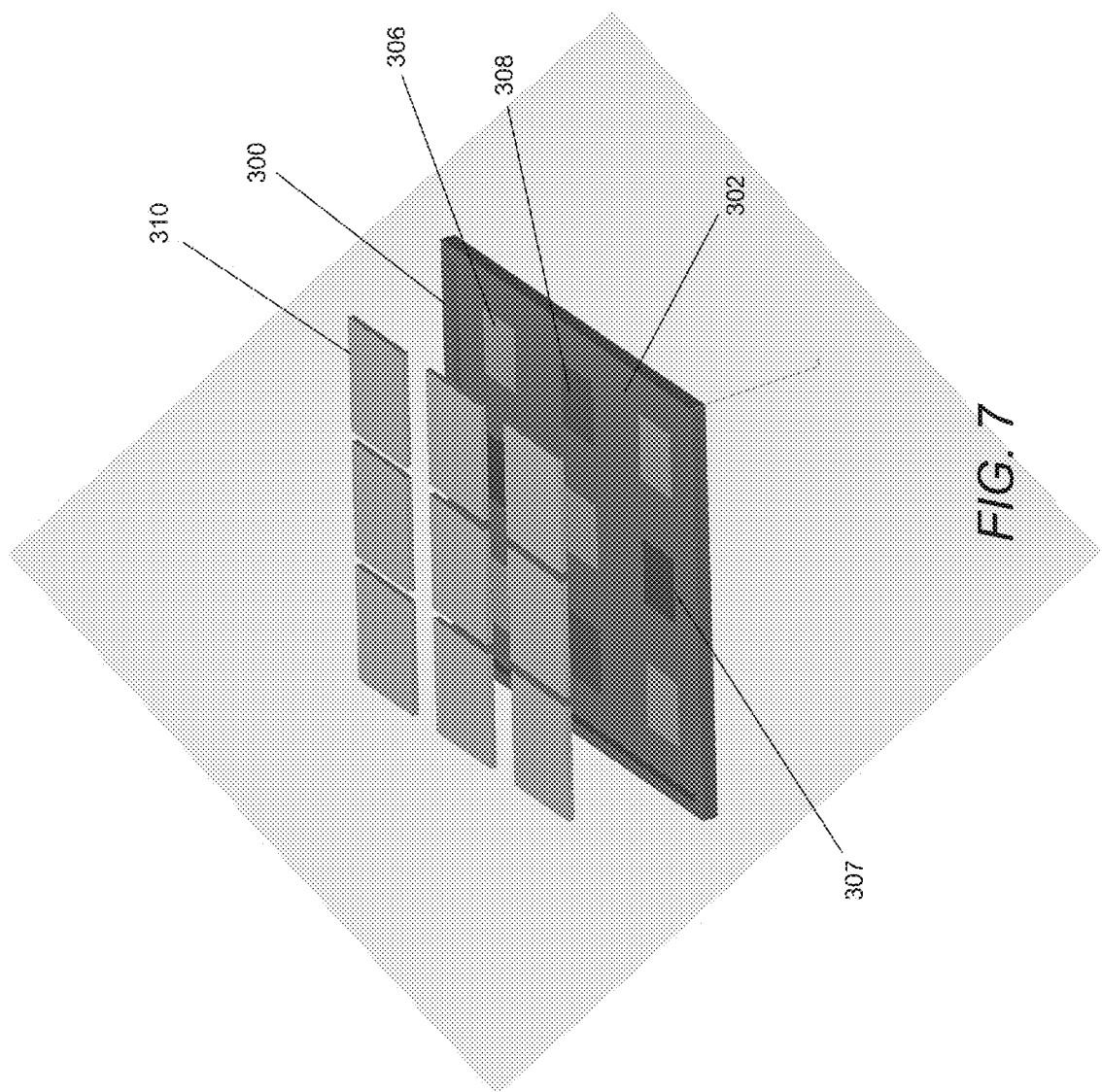
FIGS. 7 and 8 conceptually illustrate the mounting of sensors that each contain a single focal plane on a carrier during the construction of an array camera module in accordance with an embodiment of the invention.
Figure 8:
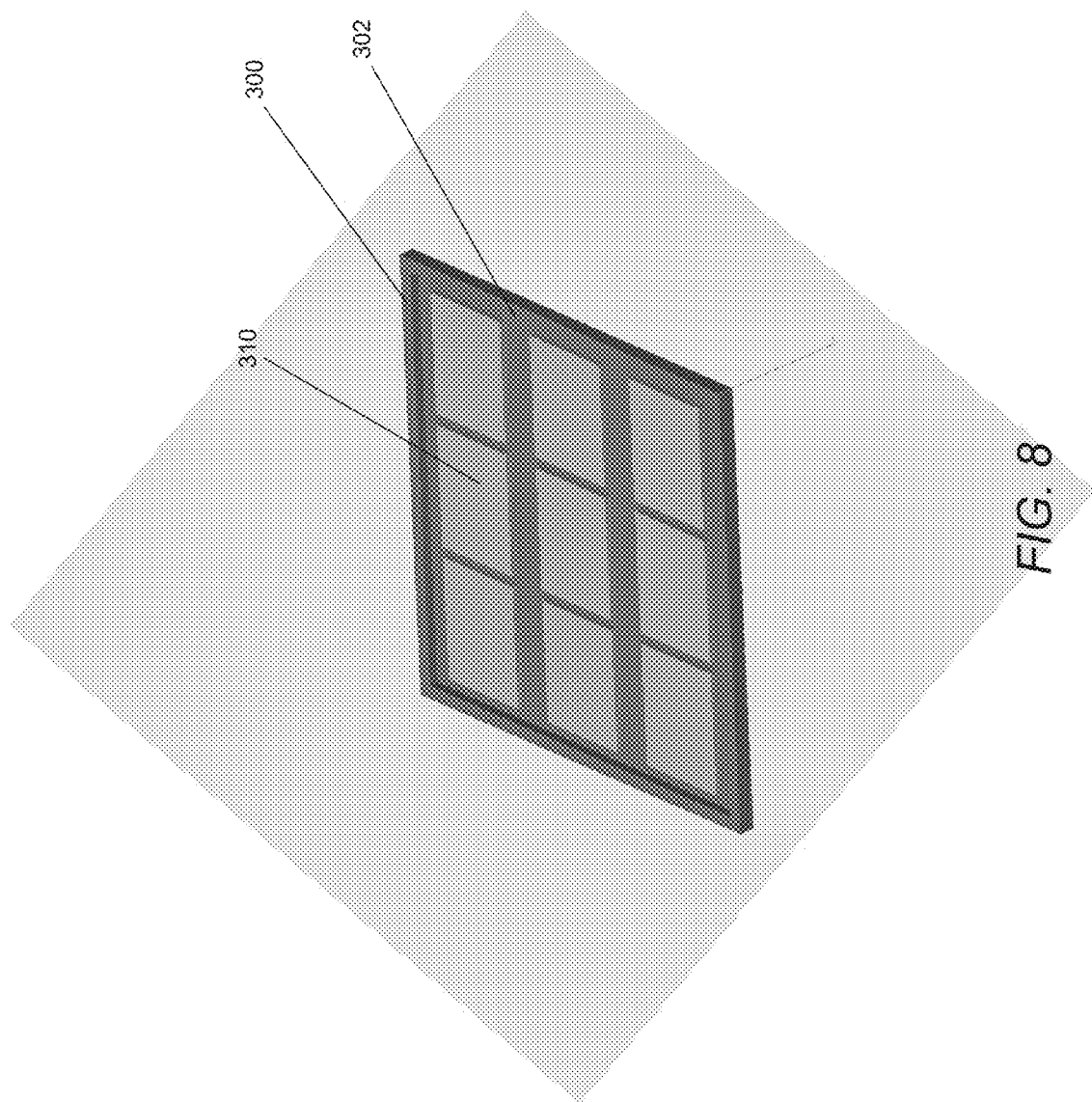
Figure 9:
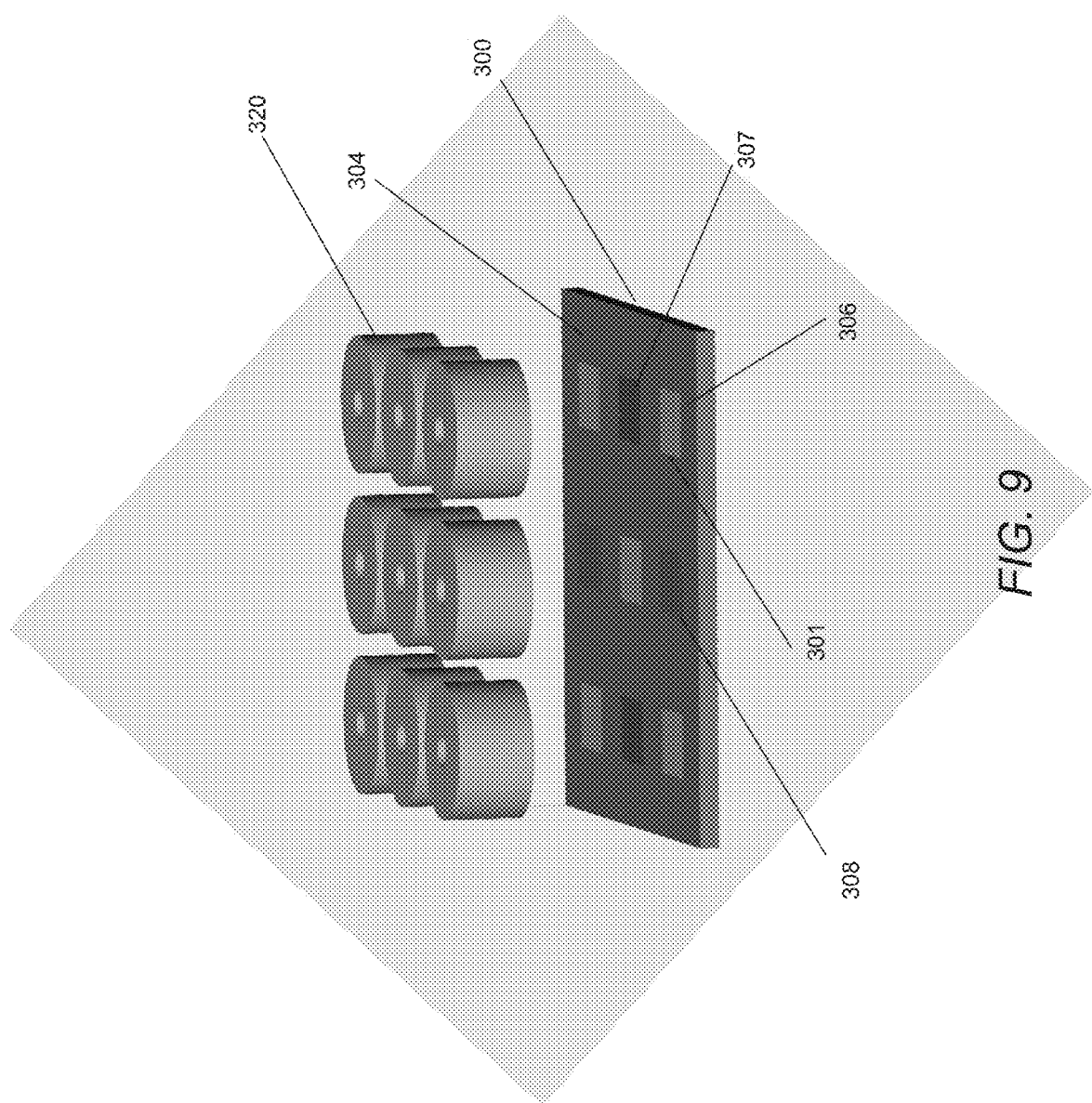
FIGS. 9 and 10 conceptually illustrate the mounting of lens barrels to a carrier during the construction of an array camera module in accordance with an embodiment of the invention.
Figure 10:
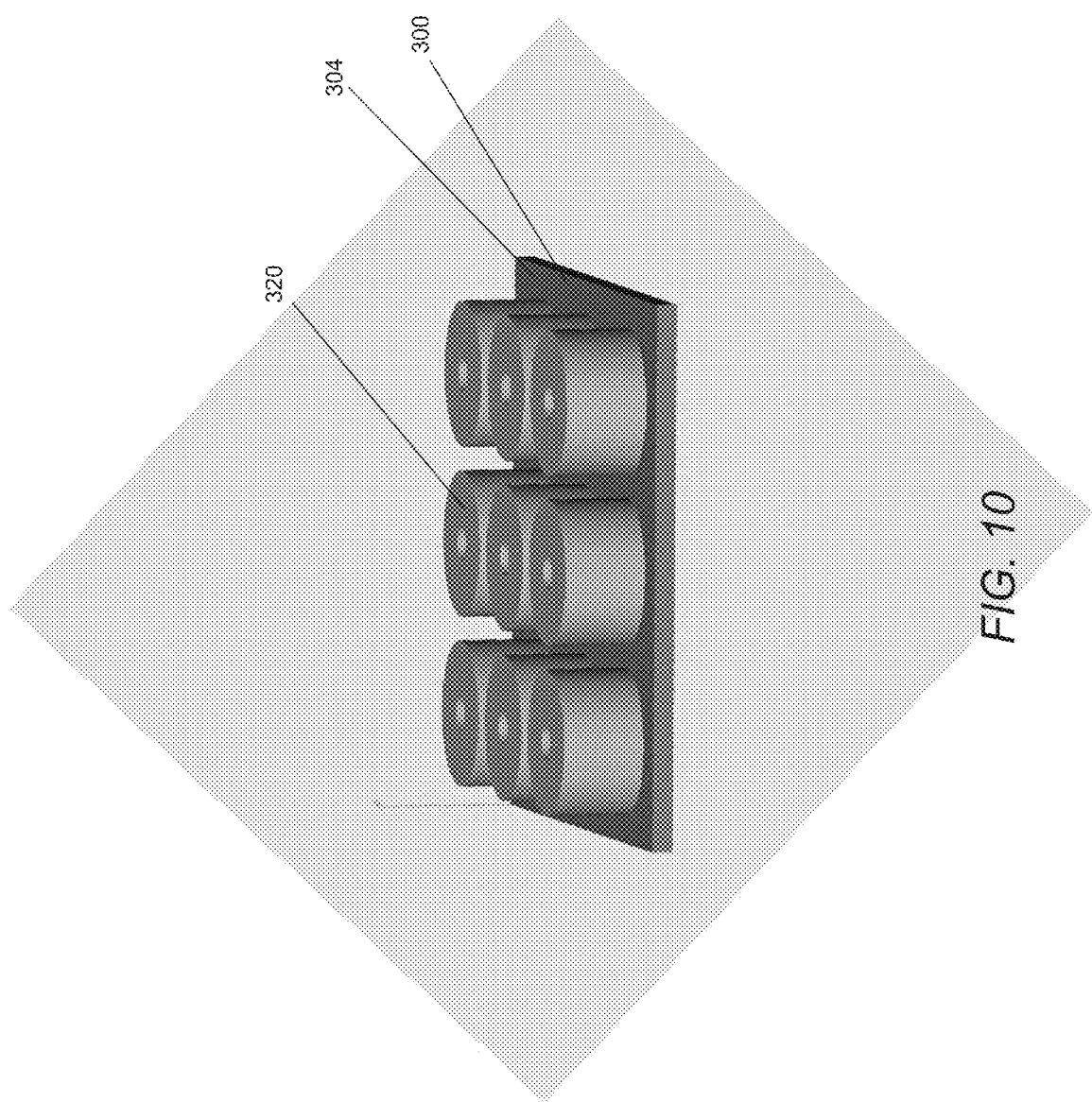

Referring again to FIG. 3, one or more sensors are mounted (364) to the carrier so that light passing through the windows in the carrier is incident on the focal planes of the sensor(s). The mounting of sensors that each contain a single focal plane is illustrated in FIGS. 7 and 8. Each sensor 310 is mounted to a first side 302 of the carrier 300. In many embodiments, the color filters are mounted within or covering the opening on the second side 304 of the carrier. In many embodiments, flip chip mounting is utilized to mount the one or more sensors to the carrier. As can readily be appreciated, the mounting of one or more sensors to the carrier is optional. Sensors can be mounted to another substrate that is fixed in a location relative to a carrier to which the lens barrels of the cameras are mounted at some stage during the construction of the array camera module.

Referring again to FIG. 3, the process 350 includes independently mounting (366) each of the lens barrels of the cameras to the carrier. The mounting of lens barrels 320 to the second surface 304 of the carrier 300 is conceptually illustrated in FIGS. 9 and 10. In many embodiments, active alignment is utilized to align each of the lens barrels to the carrier. In order to facilitate active alignment, the windows in the carrier which define the mounting locations of the lens barrels and the dimensions of the lens barrels are determined to enable an active alignment tool to grip the lens barrel during active alignment.

Figure 11:
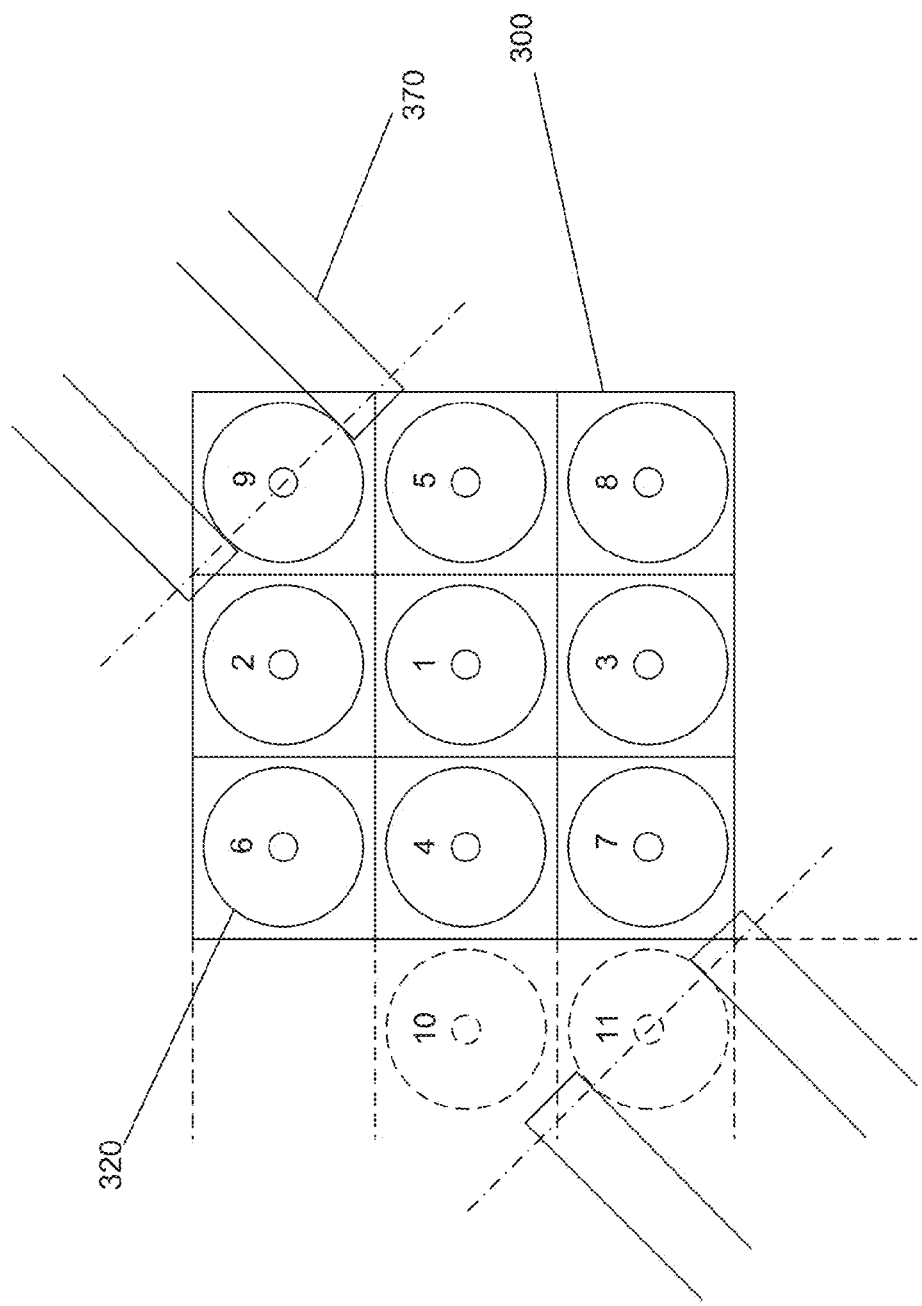
FIG. 11 conceptually illustrates an active alignment tool gripping a lens barrel at a 45 degree angle relative to a 2×2 array formed by the gripped lens barrel and three adjacent lens barrels during the construction of an array camera module in accordance with an embodiment of the invention.

In several embodiments, lens barrels can be placed close together by utilizing the ability of an active alignment tool to grip a lens barrel located adjacent three other lens barrels in a 2×2 array at an angle relative to the rows and columns of the 2×2 array. In this way, the gripper of the active alignment tool does not need to extend through the narrowest portion of the gap between any two of the adjacent lens barrels in order to place a lens barrel. Therefore, the gap between any two adjacent lens barrels is not dependent upon the dimensions of the gripper of the active alignment tool. An active alignment tool gripping a lens barrel at a 45 degree angle relative to a 2×2 array formed by the gripped lens barrel and three adjacent lens barrels in accordance with an embodiment of the invention is illustrated in FIG. 11. As can readily be appreciated the width of each member 370 of the gripper is greater than the spacing between adjacent lens barrels. By clasping the members of the gripper so that they contact lens barrel 9 at an angle relative to the rows and columns of the array of lens barrels, the members 370 of the gripper need not extend into the narrowest portion of the gap between adjacent lens barrels (2) and (5). While the axis on which the lens barrel is gripped in the illustrated embodiment is at a 45 degree angle relative to the axes of the rows and columns of the lens barrel array, the specific angle of the axis on which the lens barrel is gripped relative to the axes of the rows and columns of the lens barrel array is largely determined based upon the dimensions of the gripper of the active alignment machine and the available spacing between adjacent lens barrels. In the illustrated embodiment, the lens barrels 320 are numbered to indicate the order in which the lens barrels were placed on the carrier 300. The first lens barrel (1) placed on the carrier using the active alignment machine was placed in the center of the carrier. Lens barrels (2), (3), (4), and (5) were then placed in the remaining positions within a 3×3 array that are not corners. Finally, lens barrels (6), (7), (8), and (9) were placed in the corners of the 3×3 array.

Although a specific sequence is illustrated in FIG. 11, alternative sequences can be utilized in which a pair of lens barrels is identified (4) and (7) and a third lens barrel (10) is placed using active alignment to form an L shape. A 2×2 array of lens barrels (4), (7), (10), and (11) can then be formed by positioning the gripper to contact the lens barrel of a fourth lens barrel (11) along an axis at an angle relative to the axis of the rows and columns of the 2×2 array. The process can then be repeated with respect to each adjacent pair of lens barrels (e.g. lens barrels 7 and 3) and/or each L shaped group of lens barrels formed by the placement of lens barrels (e.g. lens barrels 4, 6, and 10). Provided that the active alignment tool is not required to attempt to place a lens barrel between two lens barrels to form three lens barrels aligned along an axis, the spacing between the lens barrels can be determined in a manner that is not related to the dimensions of the gripper used to clasp the lens barrel during the active alignment process.

While specific processes for independently aligning lens stacks within an array camera module are described above with respect to FIGS. 9-11, any of a variety of techniques including passive and/or active alignment processes can be utilized as appropriate to the requirements of specific applications in accordance with embodiments of the invention.

Figure 12:
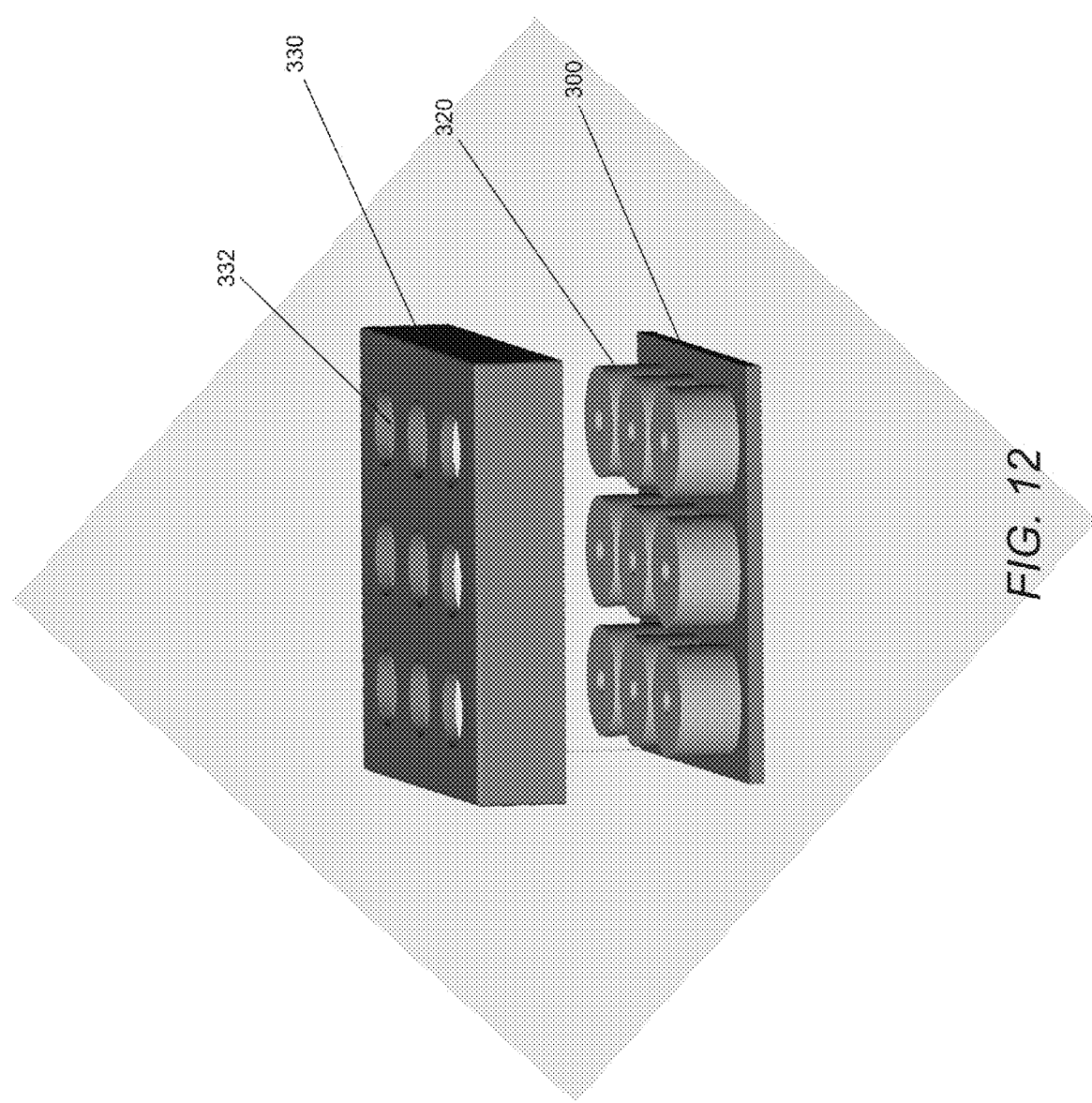
FIG. 12 conceptually illustrates attachment of a module cap to a carrier during the construction of an array camera module in accordance with an embodiment of the invention.

Referring back to FIG. 3, a module cap can be mounted (368) over the lens barrels and attached to the carrier to protect the lens barrels. Attachment of a module cap to a carrier in accordance with an embodiment of the invention is illustrated in FIG. 12. As noted above, the module cap 330 includes openings 332 that admit light into the lens stacks contained within the lens barrels 320. Ideally, the openings in the module cap are dimensioned so that the module cap is not visible within the field of view of any of the lens stacks and/or so that light does not reflect from the module cap into the lens stacks. In several embodiments, a small air gap exists between the module cap and the top of the lens barrels. A small bead of adhesive can be applied to each of the lens barrels to seal the air gap between the module cap and the lens barrels. In a number of embodiments, the module cap is constructed from a low CTE polymer such as (but not limited to) a glass filled liquid crystal polymer. By utilizing a low CTE polymer, warping of the lens barrels due to CTE mismatch between the carrier and the module cap can be avoided. In other embodiments, the module cap can be constructed from any material appropriate to the requirements of a specific application.

Although a variety of processes are described above in reference to FIGS. 3-12 with respect to the manufacture of array camera modules, various aspects of the processes described above can be utilized to construct any of a variety of array camera modules that incorporate an array of independently aligned lens stacks as appropriate to the requirements of specific applications in accordance with embodiments of the invention. Furthermore, not all of the components discussed above need to be mounted to the same carrier and/or additional components can be mounted to carriers in accordance with embodiments of the invention. Array camera modules that incorporate an interface device mounted within the array camera module to enable communication with a processor in accordance with embodiments of the invention are discussed further below.

Interfacing with External Devices

Reading image data from an array camera module can involve reading image data from each of the active sensors within the array camera module. The process of communicating with each of the sensors in an array camera module can be simplified by utilizing a separate interface device that is responsible for multiplexing image data received from multiple sensors for output to an external device and for controlling imaging parameters of individual sensors in response to commands received from external devices. In a number of embodiments, the substrate or carrier to which the sensors are mounted includes electrical traces that can be utilized to carry signals between the sensors and the interface device.

Figure 13:
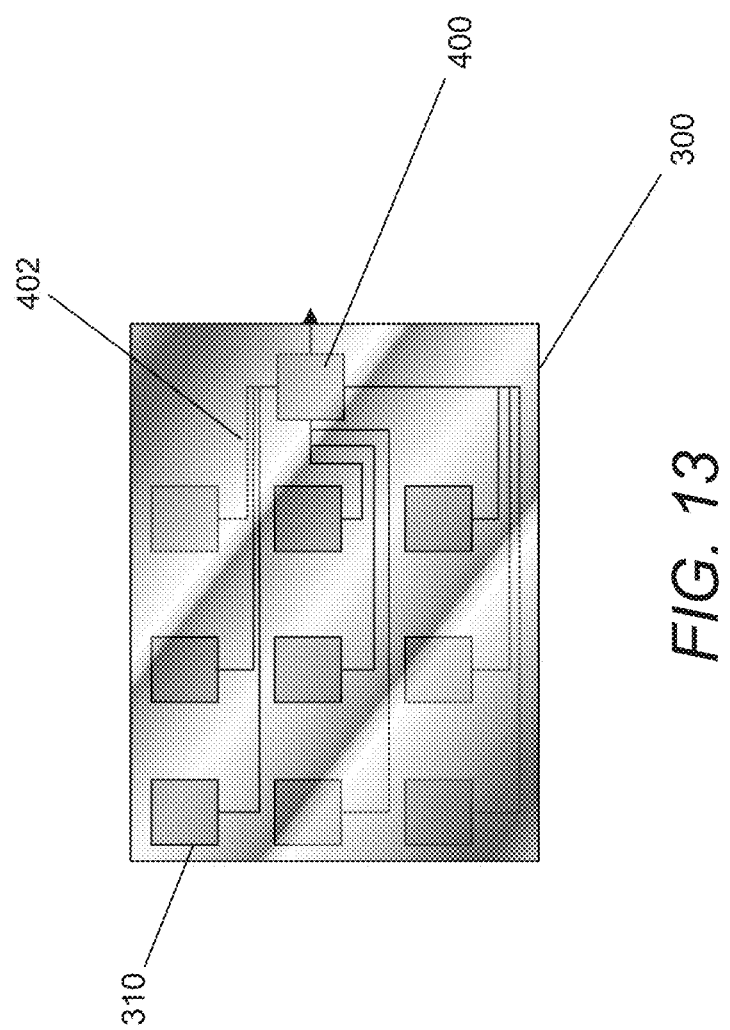
FIG. 13 conceptually illustrates an array camera module including a carrier on which a 3×3 array of sensors and an interface device are mounted in accordance with an embodiment of the invention.

An array camera module including a carrier on which a 3×3 array of sensors and an interface device are mounted is illustrated in FIG. 13. The 3×3 array of sensors 310 and the interface device 400 are mounted to a carrier 300 on which circuit traces 402 are patterned. In a number of embodiments, the sensors 310 communicate with the interface device 400 using low-voltage differential signaling (LVDS). In several embodiments, a common clock signal coordinates the capture and readout of image data by the sensors and the interface device 400 multiplexes the captured image data received via the LVDS connections for output via an interface appropriate to a specific processor. In certain embodiments, the interface device 400 communicates with external devices such as processors and/or graphics processors using a MIPI CSI 2 output interface supporting four lane video read-out of video at 30 fps from the array camera module. The bandwidth of each lane can be optimized for the total number of pixels in the sensor(s) within the array camera module and the desired frame rate. The use of various interfaces including the MIPI CSI 2 interface to transmit image data captured by an array of focal planes to an external device in accordance with embodiments of the invention is described in U.S. Pat. No. 8,305,456 to McMahon, the disclosure of which is incorporated by reference herein in its entirety. In other embodiments, any interface appropriate to the requirements of specific applications can be utilized including interfaces that enable the control of the imaging parameters of groups of focal planes by an external device in a manner similar to that described in U.S. Provisional Patent Publication No. 2014/0132810 entitled "Systems and Methods for Array Camera Focal Plane Control" to McMahon, filed Nov. 13, 2013, the disclosure of which is incorporated by reference herein in its entirety.

Figure 14:
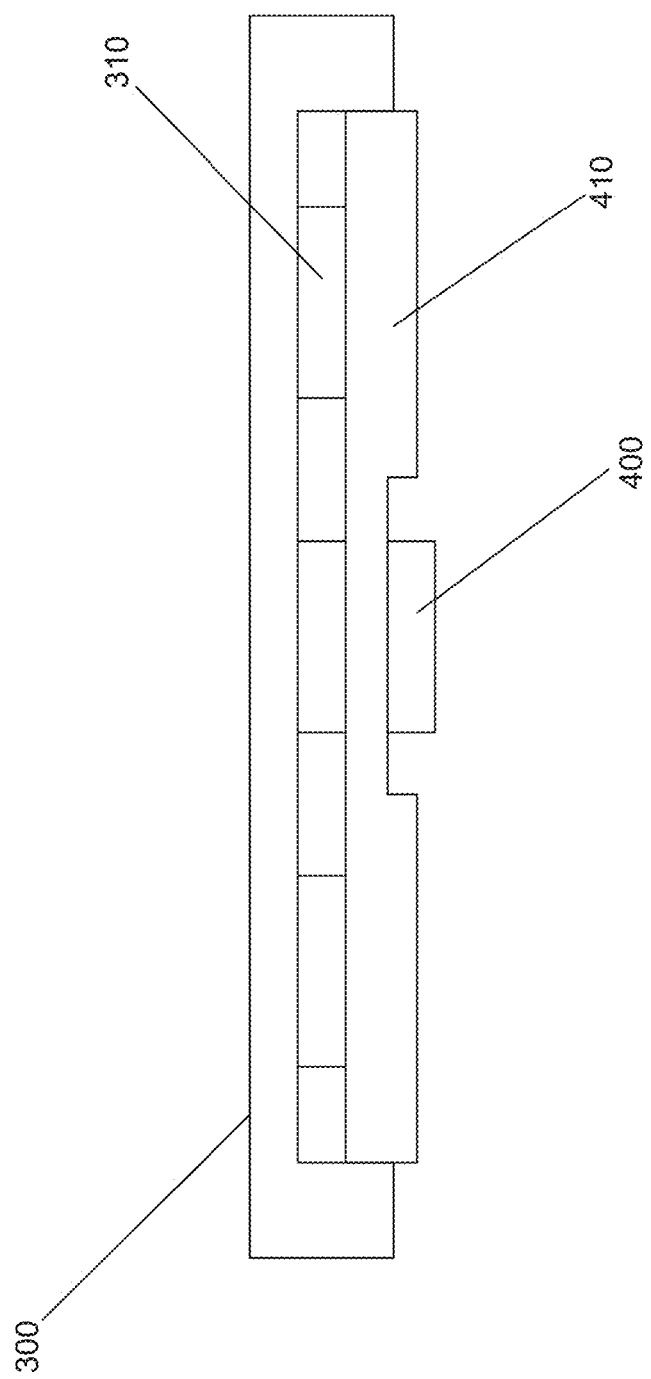
FIG. 14 conceptually illustrates a substrate assembly that can be utilized in the construction of an array camera module in accordance with an embodiment of the invention.

In embodiments where one or more sensors are mounted to a separate substrate to the carrier, an interface device can also be mounted to the substrate. A substrate assembly that can be utilized in the construction of an array camera module in accordance with an embodiment of the invention is illustrated in FIG. 14. The substrate assembly comprises a substrate 410 to which multiple sensors 310 and an interface device 400 are attached. The substrate 410 is bonded to a carrier 300 to which lens barrels can be independently mounted utilizing processes similar to those outlined above. In many instances the substrate is bonded to the carrier and the windows through the carrier are dimensioned to provide sufficient tolerances to ensure that the focal planes of each of the sensors are positioned within the openings. Although the illustrated embodiment includes multiple sensors, a similar configuration can also be utilized with a single sensor that forms multiple focal planes (the imaging parameters and read-out of which may or may not be independently controlled).

In many embodiments, a single sensor is utilized. A camera module in which lens barrels and a sensor are mounted to a carrier in accordance with an embodiment of the invention is illustrated in FIG. 15. The camera module 1500 includes four lens barrels 1502 and a single sensor 1504 that are attached to a carrier 1506, which is constructed from a transparent glass material. As can readily be appreciated, a camera module to which lens barrels and a single sensor are attached can utilize any of a variety of carrier materials as appropriate to the requirements of specific applications in accordance with embodiments of the invention.

Although the present invention has been described in certain specific aspects, many additional modifications and variations would be apparent to those skilled in the art. It is therefore to be understood that the present invention can be practiced otherwise than specifically described. Thus, embodiments of the present invention should be considered in all respects as illustrative and not restrictive.

What is claimed is:

1. An array camera, comprising: a processor; memory containing an image capture application; an array camera module, comprising: at least one carrier in which at least one window is formed; at least one sensor mounted relative to the at least one carrier so that light passing through the at least one window in the at least one carrier is incident on a plurality of focal planes formed by at least one array of pixels on the at least one sensor; a plurality of lens barrels mounted to the at least one carrier, so that a lens stack in each lens barrel directs light through the at least one window in the at least one carrier and focuses the light onto one of the plurality of focal planes; and a module cap mounted over the lens barrels, where the module cap includes at least one opening that admits light into the lens stacks contained within the plurality of lens barrels; wherein the image capture application directs the processor to: trigger the capture of image data by the array camera module; obtain and store image data captured by the array camera module, where the image data forms a set of images captured from different viewpoints; select a reference viewpoint relative to the viewpoints of the set of images captured from different viewpoints; normalize the set of images to increase a similarity of corresponding pixels within the set of images; determine depth estimates for pixel locations in an image from the reference viewpoint using at least a subset of the set of images, wherein generating a depth estimate for a given pixel location in the image from the reference viewpoint comprises: identifying pixels in the at least a subset of the set of images that correspond to the given pixel location in the image from the reference viewpoint based upon expected disparity at a plurality of depths; comparing the similarity of the corresponding pixels identified at each of the plurality of depths; and selecting the depth from the plurality of depths at which the identified corresponding pixels have the highest degree of similarity as a depth estimate for the given pixel location in the image from the reference viewpoint.

2. The array camera of claim 1, wherein the at least one carrier is a single carrier.

3. The array camera of claim 2, wherein:
each of the plurality of sensors is mounted to a first side of the single carrier;
each of the plurality of lens barrels is mounted to a second opposite side of the single carrier; and
the plurality of sensors comprises a separate sensor for each of the plurality of lens barrels.

4. The array camera of claim 2, wherein:
the plurality of sensors is mounted to a substrate and the single carrier is mounted in a fixed location relative to the substrate; and
the plurality of sensors is positioned proximate a first side of the single carrier and each of the plurality of lens barrels is mounted to a second opposite side of the single carrier.

5. The array camera of claim 2, wherein the at least one sensor is a single sensor.

6. The array camera of claim 5, wherein:
the single sensor is mounted to a first side of the single carrier; and
each of the plurality of lens barrels is mounted to a second opposite side of the single carrier.

7. The array camera of claim 5, wherein:
the single sensor is mounted to a substrate and the single carrier is mounted in a fixed location relative to the substrate; and
the single sensor is positioned proximate a first side of the single carrier and each of the plurality of lens barrels is mounted to a second opposite side of the single carrier.

8. The array camera of claim 1, wherein:
the at least one sensor is mounted to a substrate and each of a plurality of carriers is mounted in a fixed location relative to the substrate; and
each of the plurality of lens barrels is mounted to a separate carrier.

9. The array camera of claim 1, wherein:
each lens barrel and corresponding focal plane forms a camera;
different cameras within the array camera module image different parts of the electromagnetic spectrum; and
the lens stacks contained within the lens barrels differ depending upon the portion of the electromagnetic spectrum imaged by the camera to which the lens barrel belongs.

10. The array camera of claim 1, wherein each lens stack in the lens barrels has a field of view that focuses light so that the plurality of arrays of pixels that form the focal planes sample the same object space within a scene.

11. The array camera of claim 10, wherein:
the pixel arrays of the focal planes define spatial resolutions for each pixel array;
the lens stacks focus light onto the focal planes so that the plurality of arrays of pixels that form the focal planes sample the same object space within a scene with sub-pixel offsets that provide sampling diversity; and
the lens stacks have modulation transfer functions that enable contrast to be resolved at a spatial frequency corresponding to a higher resolution than the spatial resolutions of the pixel arrays.

12. The array camera of claim 11, wherein the image capture application further directs the processor to fuse pixels from the set of images using the depth estimates to create a fused image having a resolution that is greater than the resolutions of the images in the set of images by:
determining the visibility of the pixels in the set of images from the reference viewpoint by:
identifying corresponding pixels in the set of images using the depth estimates; and
determining that a pixel in a given image is not visible in the reference viewpoint when the pixel fails a photometric similarity criterion determined based upon a comparison of corresponding pixels; and applying scene dependent geometric shifts to the pixels from the set of images that are visible in an image from the reference viewpoint to shift the pixels into the reference viewpoint, where the scene dependent geometric shifts are determined using the current depth estimates; and fusing the shifted pixels from the set of images to create a fused image from the reference viewpoint having a resolution that is greater than the resolutions of the images in the set of images.

13. The array camera of claim 12, wherein the image capture application further directs the processor to synthesize an image from the reference viewpoint by performing a super-resolution process based upon the fused image from the reference viewpoint, the set of images captured from different viewpoints, the current depth estimates, and visibility information.

14. The array camera of claim 1, wherein at least one spectral filter is mounted within at least one window in the at least one carrier.

15. The array camera of claim 14, wherein the at least one spectral filter is selected from the group consisting of a color filter and an IR-cut filter.

16. The array camera of claim 1, wherein at least one spectral filter is applied to an array of pixels forming a focal plane on at least one of the sensors.

17. The array camera of claim 1, wherein at least one lens stack includes at least one spectral filter.

18. The array camera of claim 1, wherein:
the plurality of images comprises image data in multiple color channels; and
the image capture application directs the processor to compare the similarity of pixels that are identified as corresponding at each of the plurality of depths by comparing the similarity of the pixels that are identified as corresponding in each of a plurality of color channels at each of the plurality of depths.

19. The array camera of claim 1, wherein the plurality of lens barrels and the plurality of focal planes form an M×N array of cameras.

20. The array camera of claim 19, wherein the plurality of lens barrels and the plurality of focal planes form a 3×3 array of cameras.

21. The array camera of claim 19, wherein the M×N array of cameras comprises a 3×3 group of cameras comprising:
a central reference camera;
four cameras that capture image data in a first color channel located in the four corners of the 3×3 group of cameras;
a pair of cameras that capture image data in a second color channel located on either side of the central reference camera; and
a pair of cameras that capture image data in a third color channel located on either side of the central reference camera.

22. The array camera of claim 21, wherein the reference camera is selected from the group consisting of: a camera including a Bayer filter; and a camera that captures image data in the first color channel.

23. The array camera of claim 1, wherein the array camera module further comprises an interface device in communication with the at least one sensor, where the interface device multiplexes data received from the sensors and provides an interface via which the processor reads multiplexed data and via which the processor controls the imaging parameters of the focal planes formed by the plurality of pixel arrays.

24. The array camera of claim 23, wherein:
the interface device is mounted to the carrier and the carrier includes circuit traces that carry signals between the interface device and the at least one sensor; and
a common clock signal coordinates the capture of image data by the at least one sensor and readout of the image data from the at least one sensor via the interface device.

25. The array camera of claim 23, wherein:
the at least one sensor and the interface device are mounted to a substrate, which includes circuit traces that carry signals between the interface device and the at least one sensor;
the at least one carrier is mounted in a fixed location relative to the at least one sensor; and
a common clock signal coordinates the capture of image data by the at least one sensor and readout of the image data from the at least one sensor via the interface device.

26. The array camera of claim 1, wherein the module cap is mounted to the at least one carrier so that a small air gap exists between the module cap and the top of the lens barrels and a small bead of adhesive seals the air gaps between the module cap and the lens barrels.

27. The array camera of claim 1, wherein the carrier is constructed from a material selected from the group consisting of ceramic and glass.

28. A array camera, comprising: a processor; memory containing an image capture application; an array camera module, comprising: a carrier in which a plurality of windows are formed; a plurality of sensors each including an array of pixels, where the plurality of sensors are mounted relative to the carrier so that light passing through the plurality of windows is incident on a plurality of focal planes formed by the arrays of pixels; a plurality of lens barrels mounted to the at least one carrier so that a lens stack in each lens barrel directs light through the at least one window in the at least one carrier and focuses the light onto one of the plurality of focal planes; and a module cap mounted over the lens barrels, where the module cap includes at least one opening that admits light into the lens stacks contained within the plurality of lens barrels; wherein the image capture application directs the processor to: trigger the capture of image data by the array camera module; obtain and store image data captured by the array camera module, where the image data forms a set of images captured from different viewpoints; select a reference viewpoint relative to the viewpoints of the set of images captured from different viewpoints; normalize the set of images to increase a similarity of corresponding pixels within the set of images; determine depth estimates for pixel locations in an image from the reference viewpoint using at least a subset of the set of images, wherein generating a depth estimate for a given pixel location in the image from the reference viewpoint comprises: identifying pixels in the at least a subset of the set of images that correspond to the given pixel location in the image from the reference viewpoint based upon expected disparity at a plurality of depths; comparing the similarity of the corresponding pixels identified at each of the plurality of depths; and selecting the depth from the plurality of depths at which the identified corresponding pixels have the highest degree of similarity as a depth estimate for the given pixel location in the image from the reference viewpoint.

29. The array camera of claim 28, wherein:
the pixel arrays of the focal planes define spatial resolutions for each pixel array;

the lens stacks focus light onto the focal planes so that the plurality of arrays of pixels that form the focal planes sample the same object space within a scene with sub-pixel offsets that provide sampling diversity; and the lens stacks have modulation transfer functions that enable contrast to be resolved at a spatial frequency corresponding to a higher resolution than the spatial resolutions of the pixel arrays; and the image capture application further directs the processor to fuse pixels from the set of images using the depth estimates to create a fused image having a resolution that is greater than the resolutions of the images in the set of images by:

determining the visibility of the pixels in the set of images from the reference viewpoint by:

identifying corresponding pixels in the set of images using the depth estimates; and determining that a pixel in a given image is not visible in the reference viewpoint when the pixel fails a photometric similarity criterion determined based upon a comparison of corresponding pixels; and applying scene dependent geometric shifts to the pixels from the set of images that are visible in an image from the reference viewpoint to shift the pixels into the reference viewpoint, where the scene dependent geometric shifts are determined using the current depth estimates; and fusing the shifted pixels from the set of images to create a fused image from the reference viewpoint having a resolution that is greater than the resolutions of the images in the set of images.

\* \* \* \* \*